(12) United States Patent
Klein et al.

(10) Patent No.: US 8,461,655 B2
(45) Date of Patent: Jun. 11, 2013

(54) MICROMECHANICAL SOUND TRANSDUCER HAVING A MEMBRANE SUPPORT WITH TAPERED SURFACE

(75) Inventors: Wolfgang Klein, Zorneding (DE); Uwe Seidel, Munich (DE); Stefan Barzen, Munich (DE); Mohsin Nawaz, Unterhaching (DE); Wolfgang Friza, Villach (AT); Xu Cheng, Munich (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 40 days.

(21) Appl. No.: 13/077,642

(22) Filed: Mar. 31, 2011

(65) Prior Publication Data

US 2012/0248554 A1   Oct. 4, 2012

(51) Int. Cl.
*H01L 29/84* (2006.01)
*G02B 26/00* (2006.01)
*B01D 1/22* (2006.01)

(52) U.S. Cl.
USPC .............................. 257/416; 359/290; 159/5

(58) Field of Classification Search
USPC ..... 257/414, 416, E21.613, E29.324; 438/50, 438/52–53
See application file for complete search history.

(56) References Cited

U.S. PATENT DOCUMENTS

| | | | | |
|---|---|---|---|---|
| 4,063,049 A | * | 12/1977 | Pipitone et al. | 381/351 |
| 7,049,164 B2 | * | 5/2006 | Bruner | 438/32 |
| 7,561,321 B2 | * | 7/2009 | Heald | 359/290 |
| 7,660,058 B2 | * | 2/2010 | Qiu et al. | 359/239 |
| 7,835,093 B2 | | 11/2010 | Wang | |
| 2004/0207497 A1 | * | 10/2004 | Hsu et al. | 335/10 |
| 2005/0034822 A1 | * | 2/2005 | Kim et al. | 159/5 |
| 2009/0115553 A1 | * | 5/2009 | Shin et al. | 333/188 |
| 2010/0200938 A1 | | 8/2010 | Wang | |

FOREIGN PATENT DOCUMENTS

| | | |
|---|---|---|
| DE | 10 2005 035 058 A1 | 2/2007 |
| WO | WO 03/076878 A1 | 9/2003 |
| WO | WO 2007/022476 A1 | 2/2007 |
| WO | WO 2007/022479 A1 | 2/2007 |

\* cited by examiner

*Primary Examiner* — Long Tran
*Assistant Examiner* — Dzung Tran
(74) *Attorney, Agent, or Firm* — Slater & Matsil, L.L.P.

(57) ABSTRACT

A method for manufacturing a micromechanical sound transducer includes depositing successive layers of first and second membrane support material on a first main surface of a substrate arrangement with a first etching rate and a lower second etching rate, respectively. A layer of membrane material is then deposited. A cavity is created in the substrate arrangement from a side of the substrate arrangement opposite to the membrane support materials and the membrane material at least until the cavity extends to the layer of first membrane support material. The layers of first and second membrane support material are etched by applying an etching agent through the cavity in at least one first region located in an extension of the cavity also in a second region surrounding the first region. The etching creates a tapered surface on the layer of second membrane support material in the second region. The etching continues at least until the layer of second membrane support material has been removed in the first region to expose the layer of membrane material.

26 Claims, 22 Drawing Sheets

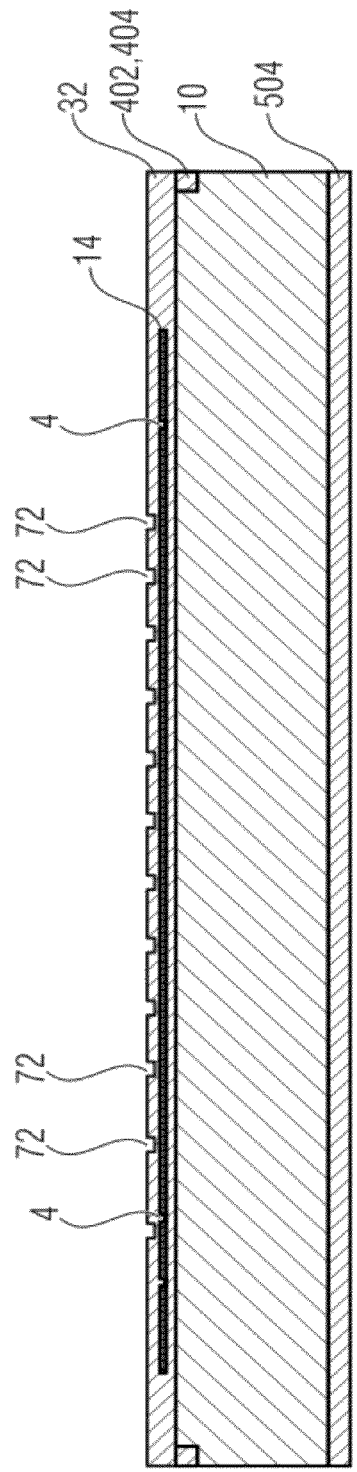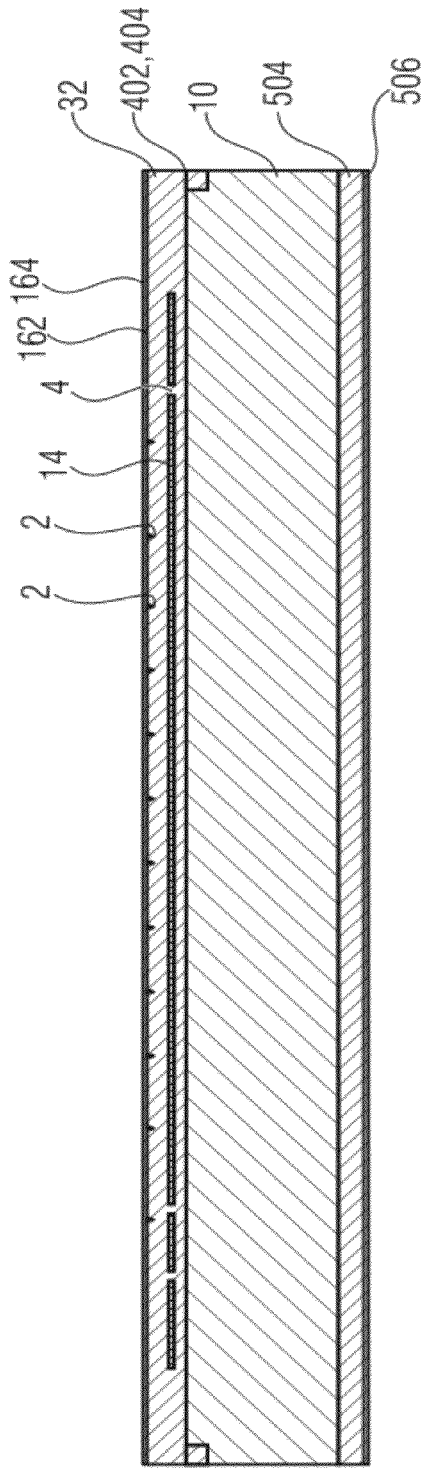

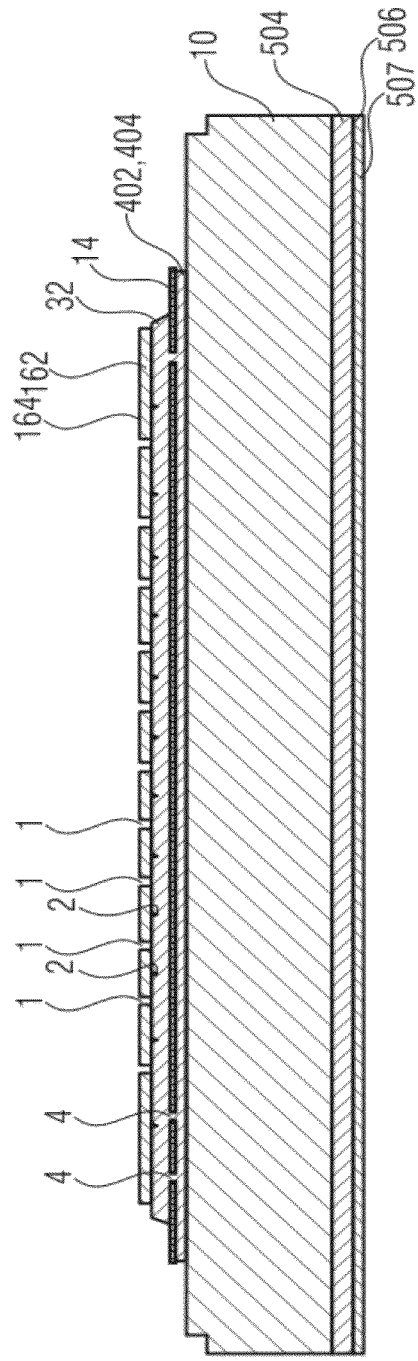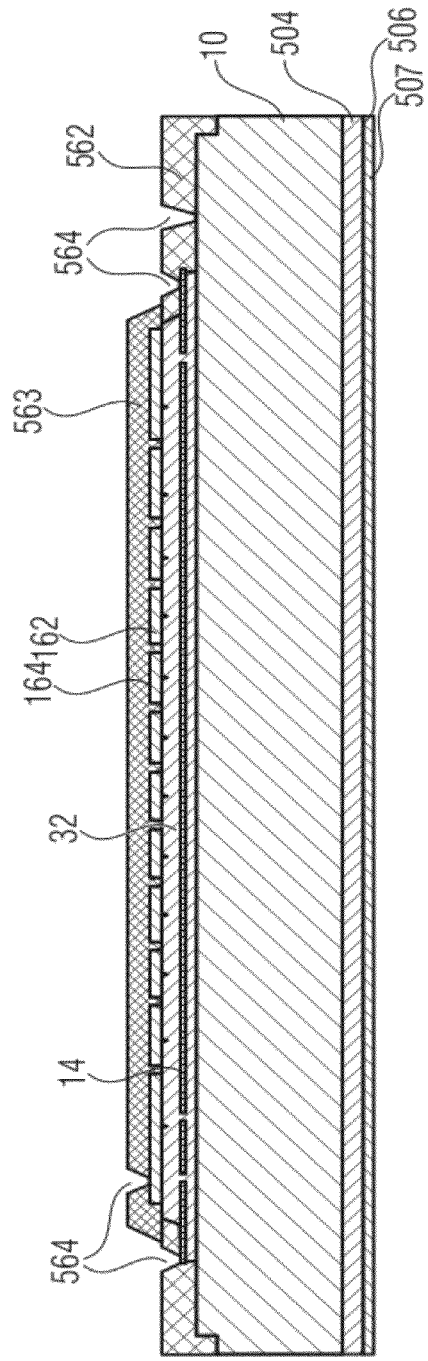

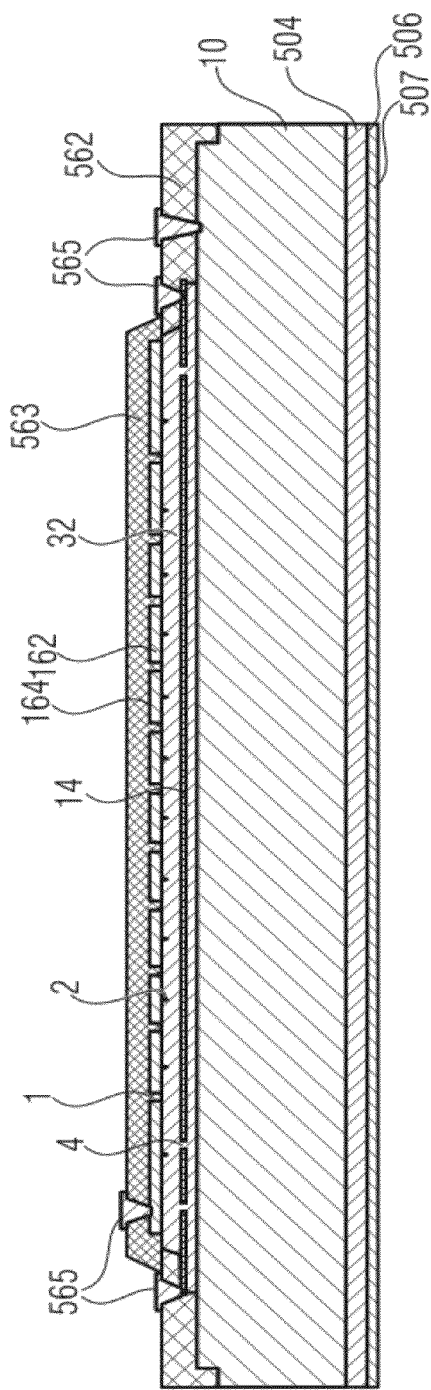
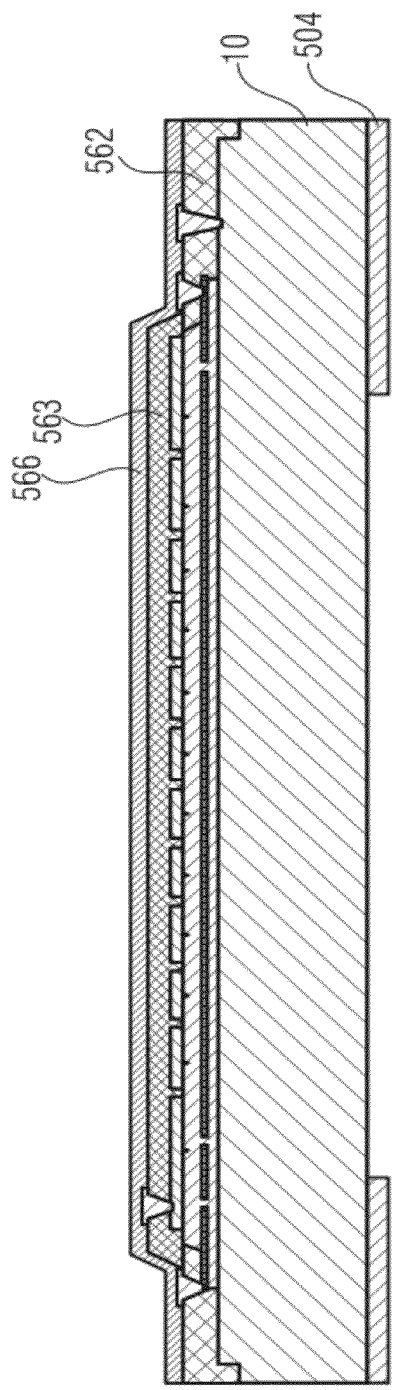

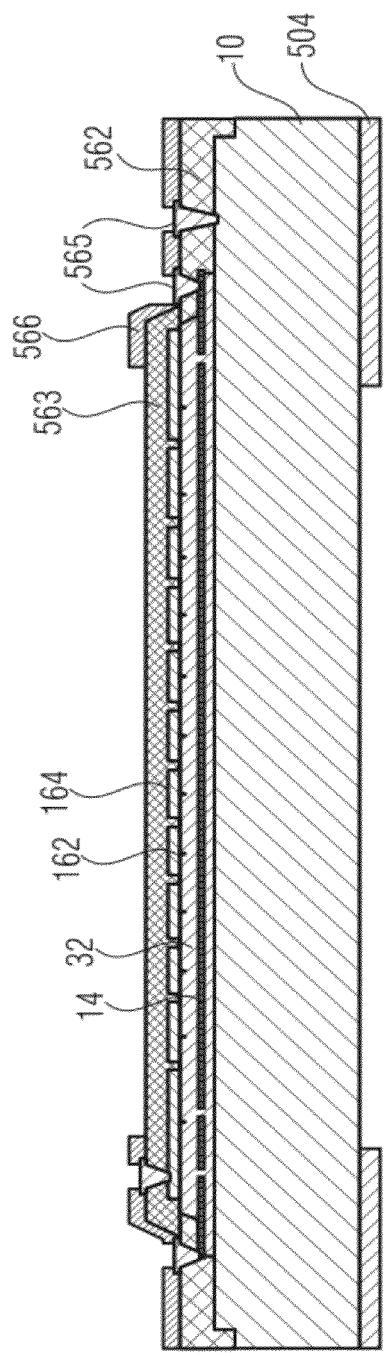
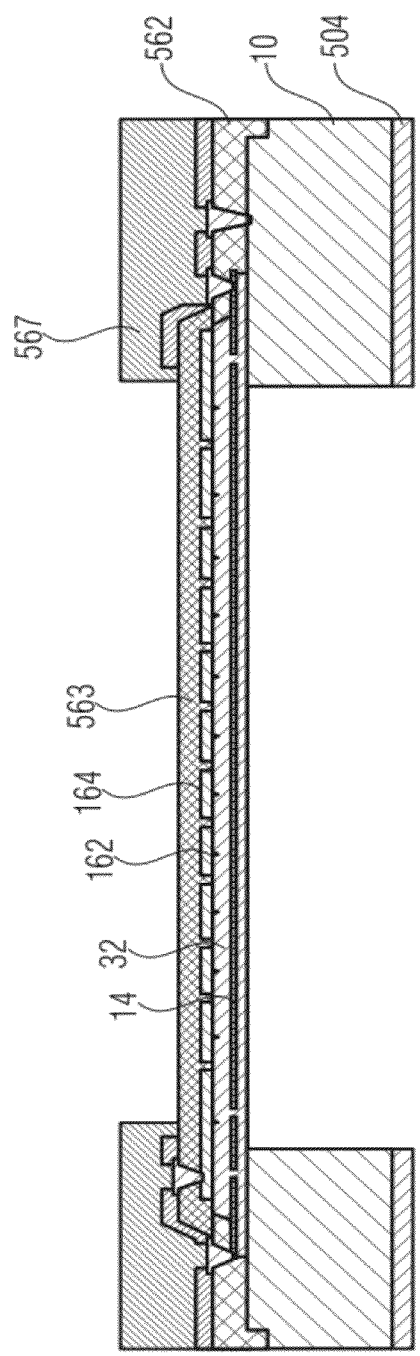
FIG 15K
FIG 15L

MICROMECHANICAL SOUND TRANSDUCER HAVING A MEMBRANE SUPPORT WITH TAPERED SURFACE

TECHNICAL FIELD

Some embodiments according to the invention are related to a method for manufacturing a micromechanical sound transducer. Some embodiments according to the invention are related to a micromechanical sound transducer.

BACKGROUND

The ability to capture a sound signal and/or to reproduce a sound signal is supported by a large number of electronic devices manufactured and used today. Amongst others, two goals foster an ongoing, intensive research in the field of electronic devices, namely, further miniaturization and improved efficiency for longer battery life. The sound subsystem of an electronic device typically needs to meet certain specifications that are largely predetermined by the physical properties of the sound signal to be captured and/or reproduced, such as the frequency range and the sound pressure level (SPL). Sound transducers based on micromechanical constructions offer promising properties with respect to miniaturization and improved efficiency. Some of these solutions propose the use of piezoelectric or ferroelectric materials on micromechanical membranes made from silicon. Due to the piezoelectric or ferroelectric materials, a new material system typically needs to be integrated into the semiconductor manufacturing process for the manufacture of such micromechanical loudspeakers. In contrast, sound transducers based on a capacitive detection/generation of membrane deflection due to a received sound signal or an electrical input signal, respectively, can typically be constructed using materials that are available or compatible with typical semiconductor manufacturing processes.

SUMMARY OF THE INVENTION

Some embodiments according to the invention provide a method for manufacturing a micromechanical sound transducer, the method comprising: depositing a layer of first membrane support material on a first main surface of a substrate arrangement; depositing a layer of second membrane support material on a main surface of the layer of first membrane support material; depositing a layer of membrane material on a main surface of the layer of second membrane support material; creating a cavity in the substrate arrangement; etching the layer of first membrane support material and the layer of second membrane support material by applying a particular etching agent through the cavity; and continuing the etching at least until the layer of second membrane support material has been removed in a first region to expose the layer of membrane material. The first membrane support material has, or exhibits, a first etching rate relative to the particular etching agent. The second membrane support material has, or exhibits, a second etching rate lower than the first etching rate relative to the particular etching agent. The cavity in the substrate arrangement is created from a side of the substrate arrangement that is opposite to the layer of first membrane support material, the layer of second membrane support material, and the layer of membrane material. After completion of the action of creating the cavity, the cavity extends to the layer of first membrane support material, at least. The etching of the layer of first membrane support material and the layer of second membrane support material takes place in at least one first region located in an extension of the cavity along a direction substantially perpendicular to the first main surface of the substrate arrangement. It also takes place in a second region surrounding the first region, wherein the etching creates a tapered surface on the layer of the second membrane support material in the second region. The tapered surface is caused by a difference between the first etching rate and the second etching rate.

In another embodiment according to the teachings disclosed herein, a method for manufacturing of a micromechanical sound transducer comprises: depositing a layer of third membrane support material on a first main surface of a substrate arrangement; depositing a layer of auxiliary material on a main surface of the layer of third membrane support material; partially masking a main surface of a layer of auxiliary material; etching a layer of auxiliary material and the layer of third membrane support material in at least one first region and also in a second region surrounding the at least one first region by applying a particular etching agent; continuing the etching at least until the layer of third membrane support material has been removed in the at least one first region to expose the substrate arrangement in the at least one first region; removing the auxiliary material and a mask created during the masking of the main surface of the layer of auxiliary material; depositing a layer of membrane material on the main surface of the layer of third membrane support material; and creating a cavity in the substrate arrangement. The third membrane support material has, or exhibits, a third etching rate relative to the particular etching agent and the auxiliary material has, or exhibits, a fourth etching rate higher than the third etching rate relative to the particular etching agent. After completion of the partial masking of the main surface of the layer of auxiliary material, the layer of auxiliary material is exposed in at least one first region and masked outside the at least one first region. The action of etching creates a tapered surface of the layer of the third membrane support material in the second region. When depositing the layer of membrane material on the main surface of the layer of third membrane support material, the membrane material substantially reproduces or follows the tapered surface of the third membrane support material. The creation of the cavity in the substrate arrangement is performed from a side of the substrate arrangement opposite to the layer of auxiliary material, the layer of third membrane support material, and the layer of membrane material at least until the cavity extends to the membrane material in the at least one first region.

Note that the presence of a third membrane support material does not necessarily imply the presence of first and second membrane support materials. The terms "third membrane support material", "third etching rate", "fourth etching rate", "fifth membrane support material", and "fifth etching rate" should be regarded as identifiers rather than enumerators. Unique identifiers for different elements have been chosen for the sake of clarity, especially in case the features of two or more embodiments are combined.

A micromechanical sound transducer according to the teachings disclosed herein comprises a substrate arrangement, a membrane support structure, an aperture in the membrane support structure, and a membrane. The membrane support structure comprises a layer of first membrane support material adjacent to the substrate arrangement and a layer of second membrane support material at an interface of the layer of first membrane support material opposite to the substrate arrangement. The first membrane support material has a first etching rate relative to a particular etching agent and the second membrane support material has a second etching rate relative to the particular etching agent that is lower than the first etching rate. The aperture in the membrane support structure is delimited, at least partly, by a tapered surface of the layer of second membrane support material. The membrane is exposed to the aperture and is fixed to the layer of second membrane support material at a surface of the second membrane support material opposite to the tapered surface.

A micromechanical sound transducer according to another embodiment of the teachings disclosed herein comprises a substrate arrangement, a membrane support structure, and a membrane. The membrane support structure comprises a layer of third membrane support material fixed to the substrate arrangement, wherein the layer of third membrane support material comprises a tapered surface. The membrane is arranged at a side of the membrane support structure opposite to the substrate arrangement. The membrane is exposed in a first region defined by an aperture in at least one of the substrate arrangement and the membrane support structure. Furthermore, the membrane is fixed to the tapered surface.

BRIEF DESCRIPTION OF THE DRAWINGS

FIGS. 15A to 15M illustrate a plurality of process steps of a method for manufacturing a micromechanical sound transducer according to the teachings disclosed herein.

DETAILED DESCRIPTION OF ILLUSTRATIVE EMBODIMENTS

Figure 1:
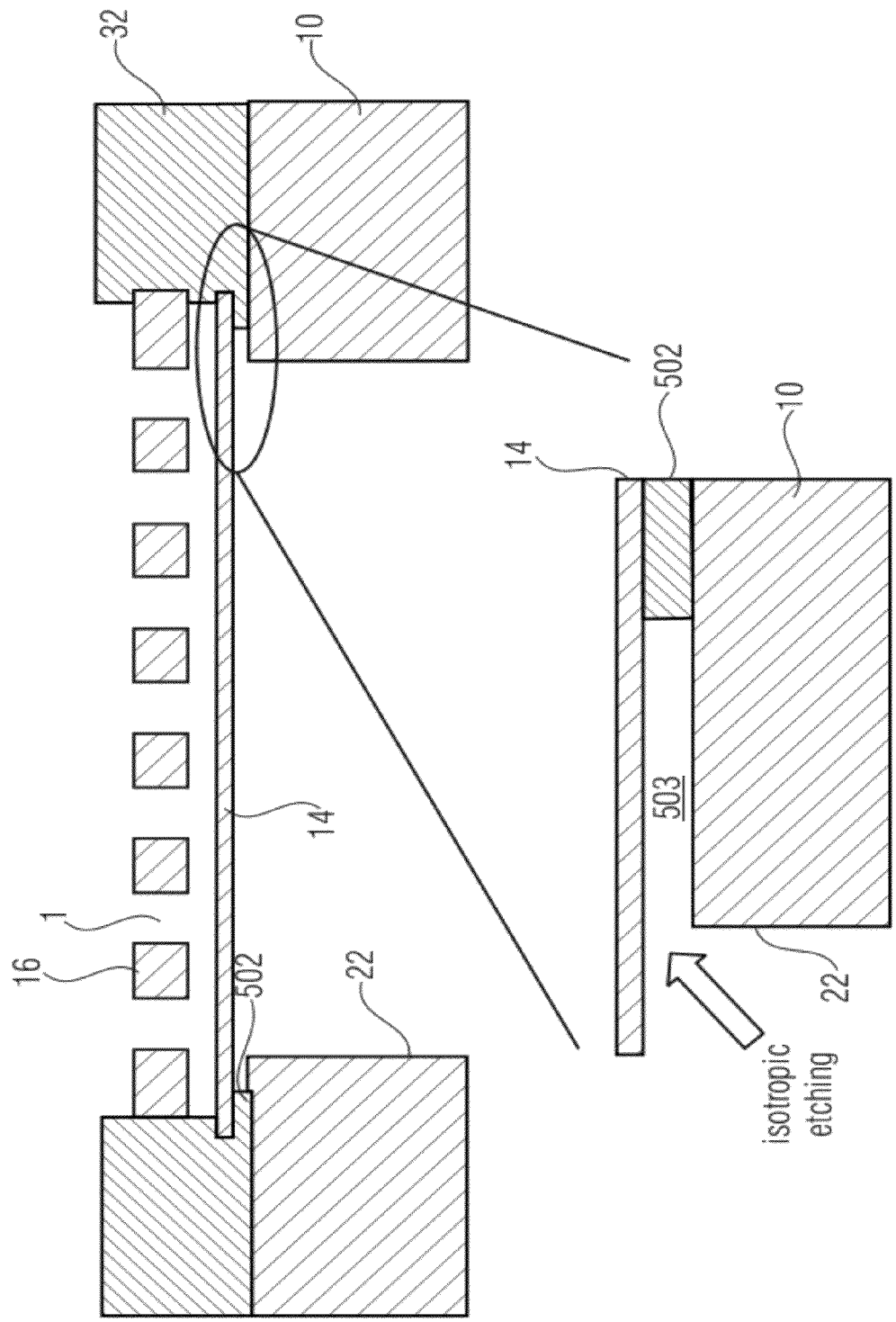
FIG. 1 shows a schematic cross section through a micromechanical sound transducer not using the teachings disclosed herein.

FIG. 1 shows a schematic cross section through a micromechanical sound transducer in which some of the core features of the teachings disclosed herein are not implemented. The micromechanical sound transducer may be a microphone, a loudspeaker, or a combined microphone and loudspeaker. The micromechanical sound transducer comprises a substrate 10, a stator or counter electrode 16, and a membrane 14. The membrane 14 and the counter electrode 16 are fixed to a support structure 32 which, in turn, is fixed to the substrate 10. Instead of a substantially homogenous substrate (e.g. silicon), a substrate arrangement may be present in this and other configurations, for example a silicon bulk having a layer of silicon oxide $SiO_2$ at a main surface of the silicon bulk. The term "being fixed" could mean "mounted to", "attached to", etc. Typically, the counter electrode 16 is substantially rigid, which may be achieved by choosing the thickness and/or the material of the counter electrode 16 appropriately. The membrane 14 is deformable so that especially a central portion of the membrane 14 may be displaced from a rest position to an excited position, in which the membrane 14 is bent towards the counter electrode 16 or even touches the counter electrode 16. The membrane 14 is mechanically connected to the support structure 32 at a circumferential portion of the membrane 14. The displacement of the membrane 14 or its central portion towards the counter electrode 16 may be achieved by exerting an electrostatic force on the membrane 14. In particular, the counter electrode 16 may electrostatically attract the membrane 14. The electrostatic effect between the counter electrode 16 and the membrane 14 is achieved by applying different electrical potentials to the counter electrode 16 and the membrane 14. The support structure 32 typically acts as an electrical insulator between the counter electrode 16 and the membrane 14. Not shown in FIG. 1 are electrical connections and connection pads by means of which the membrane 14 and the counter electrode 16 may be electrically connected to other components, such as an amplifier (not shown).

The substrate 10 has a cavity 22 beneath a first region of the membrane 14. The cavity 22 acts as a back volume of the micromechanical sound transducer and allows the membrane 14 to move relatively freely towards the counter electrode 16 and away. A plurality of air holes 1 are formed in the counter electrode 16. Thus, the membrane 14 does not have to overcome a strong counter pressure when moving towards the counter electrode 16, or a sub-pressure (vacuum) when moving away from the counter electrode 16. In the configuration shown in FIG. 1, the cavity 22 is open at an opposite side with respect to the membrane-stator arrangement, e.g., at the lower end of the cavity 22, with respect to the representation of FIG. 1. The cavity 22 is continued in the support structure 32, however with a larger cross section. A first free volume is present above the membrane 14 and a second free volume is present beneath the membrane 14, or to be more precise, above/beneath a central portion of the membrane 14, respectively. These free volumes allow the central portion of the membrane 14 to move up and down. A prolongation of the cavity 22 through the support structure 32 may be regarded as a sound transducing region of the microelectromechanical sound transducer and is referred to as "first region" elsewhere in this disclosure.

Generally, an electrostatic sound transducer comprises at last one capacitor in which one of the plates (i.e., the membrane) is moveable. When operating such a structure as a loudspeaker, the capacitor is typically electrically biased and the electrical input signal representing the audio data to be transduced modulates the electrical field. This modulation of the electrical field within the capacitor causes the membrane to oscillate. Typically, this structure has a square-law force/voltage characteristic and due to the square-law force/voltage characteristic, pronounced distortions may occur, especially for high input voltages of the audio input signal. On the other hand, when operating such a structure as a microphone, the capacitor is typically electrically biased, too. A sound signal impinging on the membrane 14 causes the membrane 14 to oscillate. This oscillation causes a modulation of the electrical field within the capacitor which can be sensed at electrical connection pads of the microelectromechanical sound transducer.

An inset in the lower part of FIG. 1 shows a detail of the micromechanical sound transducer in a schematic cross section. Between a peripheral region of the membrane 14 and the substrate 10, a layer of a membrane support material 502 serves to support the membrane 14. The layer of membrane support material 502 belongs to the membrane support structure 32. The membrane support material 502 is typically an oxide, such as silicon dioxide $SiO_2$. The membrane 14 is held, on the bottom side, by the oxide layer 502 which presents a substantially vertical edge. The cavity 22 has a substantially uniform cross section within the substrate 10 that widens up to an aperture 503 at the height of the layer of membrane support material 502. The aperture 503 is circumferentially bounded by the substantially vertical edge of the membrane support material and is typically formed by means of an isotropic etching which substantially only affects the oxide material of the layer of membrane support material 502, but not the membrane 14 and the substrate 10. By timing the isotropic etching process and controlling other parameters of the isotropic etching process such as temperature and concentration of the etching agent, the dimensions of the aperture 503 can be controlled relatively precisely. The dimensions of the aperture 503 have an influence on some of the physical properties of the membrane, such as resonance frequency and rigidity. The membrane support structure or "holding device" 32 as shown in FIG. 1 yields a high compressive strength of 5 bar for a given transducer configuration, when a compressive load is exerted from the front side (from above), but yields poor compressive strength of 1.5 bar when a compressive load is exerted from the rear side (from below).

Indeed, current manufacturing of micromechanical sound transducers shows a weakness of the membrane holding device with regard to the compressive strength when a compressive load is exerted from the rear side.

Hence, micromechanical sound transducers having a configuration as shown in FIG. 1 show a weakness of the membrane support structure with regard to the compressive strength with a compressive load exerted from the rear side.

Figure 2:
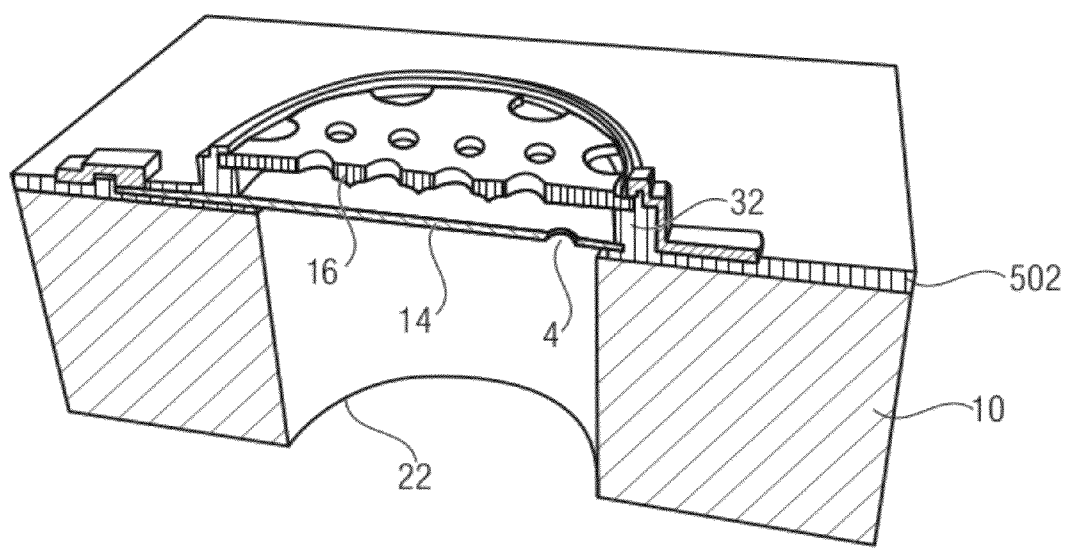
FIG. 2 shows a perspective cross section of a micromechanical sound transducer not using the teachings disclosed herein.

FIG. 2 shows a perspective view of a cross section of the micromechanical sound transducer shown in FIG. 1. The membrane 14 comprises a ventilation hole 4 which is mainly used to equalize static pressure differences between the cavity 22 and the volume above the membrane 14.

Figure 3:
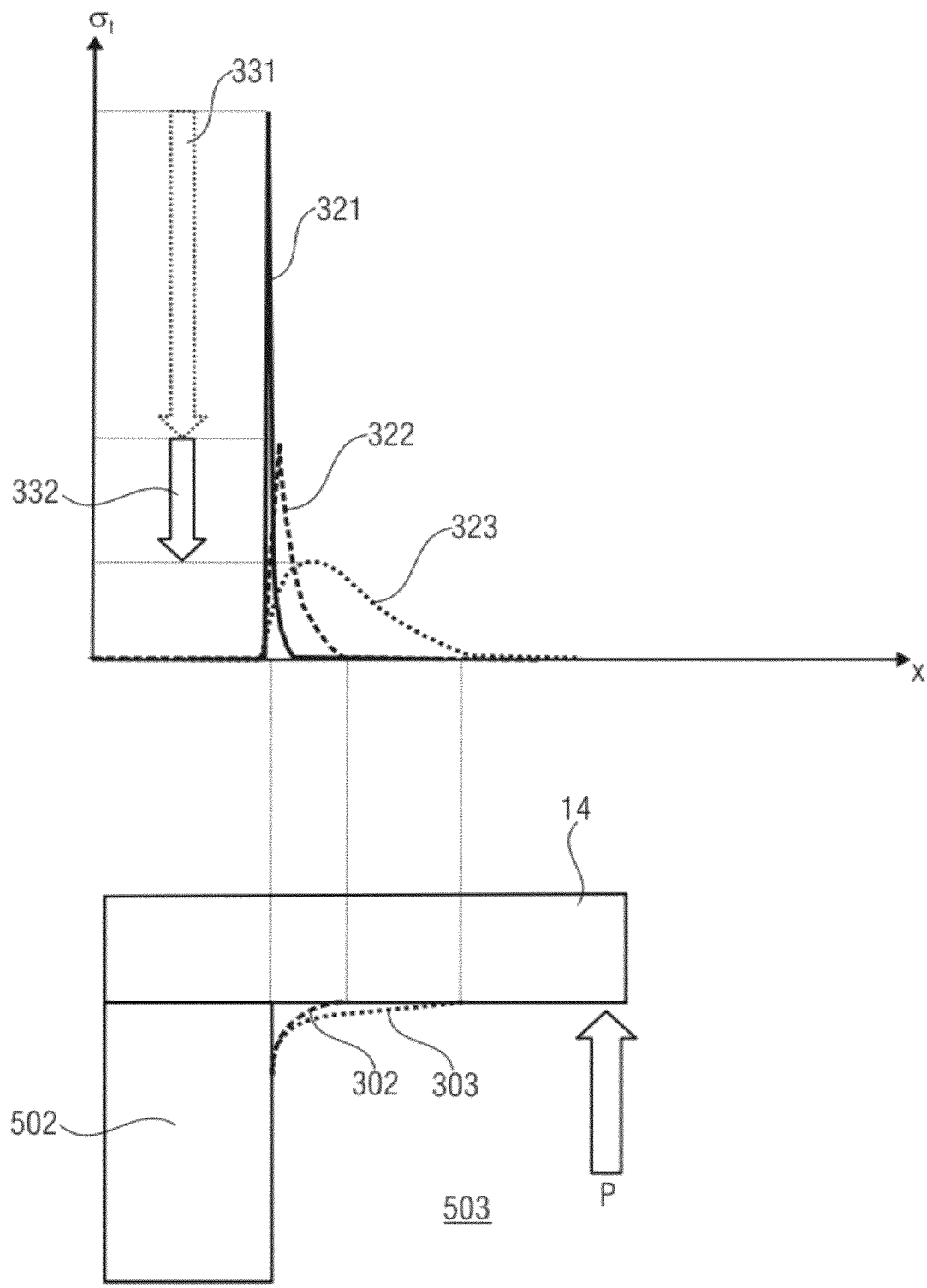
FIG. 3 shows in the lower part a partial cross section of a sound transducer and in the upper part a diagram illustrating mechanical stress as a function of the location for three different configurations.

FIG. 3 shows in the lower part a partial, schematic cross section through the layer of membrane support material 502 and the membrane 14. In FIG. 3, three different configurations for the transition between the layer of membrane support materials 502 and the membrane 14 are illustrated. It is assumed that the membrane 14 is loaded by a pressure P from below, thus exerting a compressive load on the membrane 14. Three corresponding stress curves are compared in the upper part of FIG. 3. In a first configuration, the layer of membrane support material 502 and the membrane 14 form a substantially rectangular corner, i.e., the edge of the layer of membrane support material 502 is substantially vertical (continuous line). In the upper part of FIG. 3, a stress curve 321 representing a tangential stress a corresponds to the configuration having the substantially rectangular corner between the layer of membrane support material 502 and the membrane 14. The first stress curve 321 has a high, sharp peak at the location of the substantially rectangular corner. The sharp peak in the first stress curve 321 reduces the compressive strength of the fixation of the membrane 14 to the layer of membrane support material 502. When the membrane 14 is loaded with excessive compressive loads it is possible that cracks occur where the stress is particularly high. This effect is called "stress concentration" or "notch effect".

A second configuration is illustrated by means of the dashed line 302 in the lower part of FIG. 3. According to this second configuration, the transition between the layer of membrane support material 502 and the membrane 14 is moderately curved. In the upper part of FIG. 3 a stress line 322 illustrates the tangential stress $\sigma_t$ for this second configuration. As indicated by the arrow 331, a significant reduction of the maximal value of the stress can be achieved by choosing the second configuration over the first configuration. The stress curve 322 also shows that the stress is distributed over a larger region compared to the stress curve 321, the region for the second configuration approximately corresponding to the extension of the rounded corner 302.

A further reduction of the maximal value of the tangential stress $\sigma_t$ can be achieved by opting for the third configuration which is illustrated in the lower part of FIG. 3 by the dotted line 303. In the upper part of FIG. 3, the stress curve 323 shows the corresponding stress distribution. The further reduction of the maximal stress value between the second configuration and the third configuration is illustrated by the arrow 332. The stress curve 323 is relatively flat and it can be seen that the stress is distributed over a relatively large region.

The teachings disclosed herein provide for a reduction of the notch effect or stress concentration, by optimizing the edge shape of the membrane support structure and, consequently, to achieve a more uniform strain distribution within the membrane support structure. Furthermore, the specific order or sequence of materials and their different responses to different etching agents makes is possible to etch selected sub-structures of the sound transducer independently from each other. In this manner, some etching processes can be controlled to provide a relatively high precision, while other etching processes are faster. The relatively high precision etching processes may be used to etch structures that are close to the membrane, such as a release etch of the membrane.

According to these teachings the problem of compressive strength being poor when a compressive load is exerted from the rear side can be solved by means of structuring the edge of the membrane support structure in order to reduce the notch effect. With the first configuration, if the membrane 14 is deflected from below by a compressive load, the notch effect will result in a large amount of mechanical tension directly at the membrane support structure 32. The maximum value of the tension may be reduced by providing the membrane support structure with a thin collar as illustrated by means of the curved lines 302 and 303 for the second and third configurations in FIG. 3, respectively. The collar leads to a more widespread distribution of the mechanical tension approximately to the region of the collar structure, consequently to a reduction of the maximum value of the tension, and further consequently to increased compressive strength.

Figure 4:
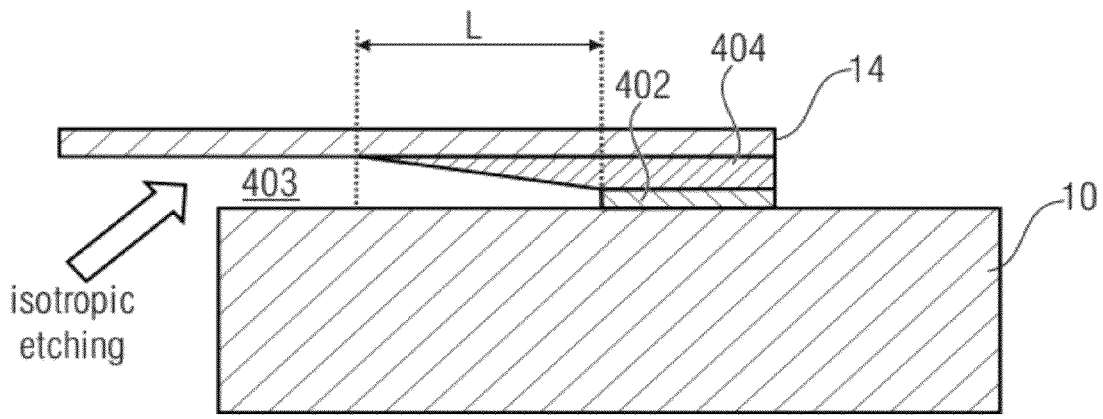
FIG. 4 shows a schematic, partial cross section of a micromechanical sound transducer according to a first embodiment of the teachings disclosed herein.

FIG. 4 shows a partial, schematic cross section of a micromechanical sound transducer according to a first possible configuration under to the teachings disclosed herein. According to the first possible configuration, the membrane support structure is produced comprising a collar. On an upper, first main surface of the substrate 10 a layer of first membrane support material 402 is provided. The layer of first membrane support material 402 has been structured during a manufacturing process of the micromechanical sound transducer so that in the illustrated finished sound transducer a remaining patch of the layer of first membrane support material is present. Above the layer of first membrane material 402, i.e., at a main surface of the layer of first membrane support material opposite to the substrate 10, a layer of second membrane support material 404 is located. The layer of second membrane support material 404 may foam a collar or a collar-like structure. In FIG. 4 depicted to the left of the layer of first membrane support material 402 and of the layer of second membrane support material 404, an aperture 403 is formed. The layer of the second membrane support material 404 has a tapered surface delimiting the aperture 403. The membrane 14 is located at an upper main surface of the layer of second membrane support material 404, i.e., opposite to the layer of first membrane support material 402. Due to the tapered surface of the layer of second membrane support material 404, a width of the layer of second membrane support material 404 increases by a value L between a lower main surface and the upper main surface of the layer of second membrane support material 404. The terms "taper" or "tapered" may encompass continuous surfaces or edges, curved surfaces or edges, as well as stepped surfaces or edges. Other implementations of tapered surfaces/edges may also fall under the terms "taper" and "tapered."

The aperture 403 has been obtained during a manufacturing process of the micromechanical sound transducer by means of an isotropic etching process. The layer of first membrane support material has a first etching rate relative to an etching agent used during the isotropic etching process. This first etching rate is typically relatively high. The layer of second membrane support material 404 has a second etching rate which is relatively low with respect to the used etching agent. In any case, the second etching rate is typically lower than the first etching rate. The etching agent typically does not significantly etch the membrane 14 and the substrate 10.

The above-mentioned width L of the tapered surface of the layer of second membrane material 404 depends on the thickness of the layer of second membrane support material 404 and also on a ratio of the first etching rate and the second etching rate, i.e., $$L = \text{thickness}_{second\ membrane\ support\ material} * \text{etching rate}_1 / \text{etching rate}_2.$$

The first membrane support material may be, for example, silicon oxide $SiO_2$. The second membrane support material may be, for example, silicon oxynitride SiON. Hence, a two-layer structure comprising oxide ($SiO_2$) and oxynitride (SiON) is created. The etching rate of $SiO_2$ is clearly higher than that of SiON for certain etching agents. If isotropic wet-chemical etching is performed using a mask, a triangular overhang of SiON results, the width of which corresponds to the layer thickness and to the etching rate ratio, as explained above. A possible realization comprising a collar width of 3 µm and a collar thickness of 190 nm is shown. The collar may also be adjusted by selecting the layer thicknesses and etching rates/materials.

Figure 5:
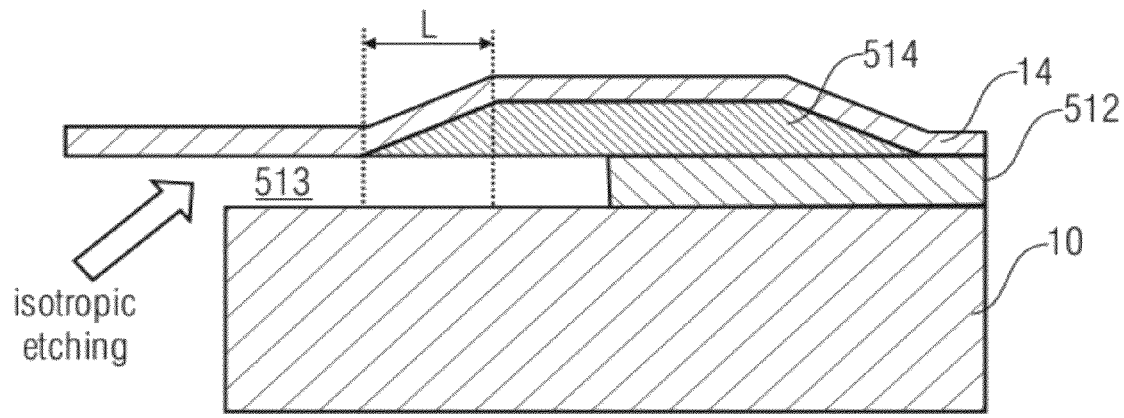
FIG. 5 shows a schematic, partial cross section of a micromechanical sound transducer according to second embodiment of the teachings disclosed herein.

The membrane support structure may also be optimized by means of a support ring and may therefore be placed inside the membrane layer. FIG. 5 shows a partial, schematic cross section of a micromechanical sound transducer according to a second possible configuration under the teachings disclosed herein featuring a reinforcement ring instead of a collar. Again, a layer of first membrane support material 512 is provided on the upper, first main surface of the substrate 10. At the main surface of the layer of first membrane support material 512 opposite to the substrate 10, a layer of third membrane support material 514 is provided. The layer of third membrane support material 514 may form a reinforcement ring or a support ring. Generally, the layer of third membrane support material 514 comprises at least one tapered surface. In FIG. 5, the layer of third membrane support material 514 comprises two tapered surfaces. A first tapered surface is provided at a radially inner side of the reinforcement ring formed by the layer of third membrane support material 514. The first tapered surface has a width L. A second tapered surface is provided at a radially outer side of the reinforcement ring. The layer of membrane material 14 covers the layer of third membrane support material 514 and locally also the layer of first membrane support material 512. In this manner, the layer of membrane material 14 follows or reproduces the tapered surface(s) of the layer of third membrane support material 514 in some regions. An aperture 513 is delimited at a lower bound by the upper main surface of the substrate 10, at a radially outer limit by the layer of first membrane support material 512, and at an upper bound by the layer of third membrane support material 514 and also by the membrane 14. The aperture 513 has been formed using an isotropic etching.

The tapered surface(s) of the layer of third membrane support material 514 has been created using an auxiliary layer adjacent to the third membrane support material at its upper main surface. The auxiliary layer has an etching rate with respect to a particular etching agent that is higher than the etching rate of the third membrane support material 514. Using a masking of the auxiliary layer in a region of the reinforcement ring, the tapered surface(s) can be obtained.

The layer of third membrane support material 514 may have a thickness ranging from 100 nm to 800 nm, preferably from 300 nm to 800 nm. The layer of auxiliary membrane support material may have a thickness ranging from 100 nm to 1000 nm, preferably from 100 nm to 500 nm.

Figure 6:
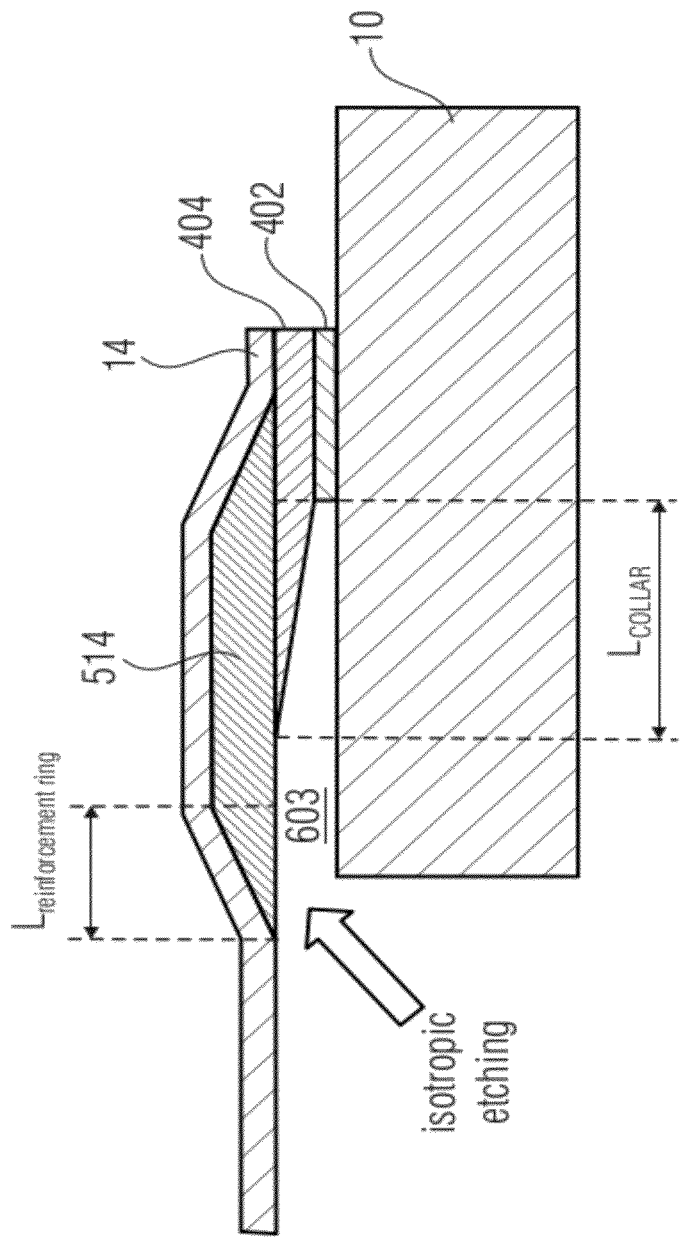
FIG. 6 shows a schematic, partial cross section of a micromechanical sound transducer according to a third embodiment of the teachings disclosed herein.

FIG. 6 shows a partial, schematic cross section of a micromechanical sound transducer according to a third possible configuration under the teachings disclosed herein in which the first and second configurations shown in FIGS. 4 and 5, respectively, have been combined. At the first main surface of the substrate 10, the layer of first membrane support material 402 (for example, silicone oxide $SiO_2$) is provided. At the surface opposite of the substrate 10, the layer of second membrane support material 404 is provided on the layer of first membrane support material 402. As before, the layer of second membrane support material 404 forms a collar or a collar-like structure. The second membrane support material 404 may be, for example, silicon oxynitride SiON and has a tapered surface. The layer of third membrane support material 514, which has already been shown in FIG. 5 and described in the corresponding description and may form, e.g., a reinforcement ring, is provided at the upper surface of the second membrane support material 404. The layer of membrane material 14 is provided at an upper surface of the layer of third membrane support material 514.

The layer of second membrane support material 404 comprises a tapered surface that partially delimits an aperture 603 between the second membrane support material 404 and the substrate 10. In a radial direction the aperture 603 is delimited by the layer of first membrane support material 402. The tapered surface of the layer of second membrane support material 404 has a width of $L_{collar}$. Also the layer of third membrane support material 514 comprises a tapered surface on which, inter alia, the layer of membrane material 14 is provided. The width of the tapered surface of the third membrane support material 514 is $L_{reinforcement\ ring}$.

The structure illustrated in FIG. 6 may have been obtained by means of a method that comprises the following actions:

Depositing a layer of first membrane support material on a first main surface of a substrate arrangement, the first substrate material having a first etching rate relative to a particular etching agent;

Depositing a layer of second membrane support material on a main surface of the layer of first membrane support material, the second membrane support material having a second etching rate lower than the first etching rate relative to the particular etching agent;

Depositing a layer of third membrane support material on a main surface of the layer of second membrane support material;

Depositing a layer of auxiliary material on a first main surface of the layer of third membrane support material, the auxiliary material having a fourth etching rate higher than the third etching rate relative to the particular etching agent, wherein the membrane material is also deposited on the layer of third membrane support material where the layer of third membrane support material covers the layer of second membrane support material;

Partially masking a main surface of the layer of auxiliary material so that the layer of auxiliary material is exposed in the at least one first region and masked outside the at least one first region;

Etching the layer of auxiliary material and the layer of third membrane support material in the at least one first region and also in the second region by applying the particular etching agent, wherein the etching creates a tapered surface of the layer of the third membrane support material in the second region;

Continuing the etching at least until the layer of third membrane support material has been removed in the at least one first region to expose the layer of second membrane support material in the at least one first region; and Removing the auxiliary material and a mask created during the masking of the main surface of the layer of auxiliary material;

Depositing a layer of membrane material on a main surface of the layer of second membrane support material;

Creating a cavity in the substrate arrangement from a side of the substrate arrangement opposite to the layer of first membrane support material, the layer of second membrane support material, and the layer of membrane material at least until the cavity extends to the layer of first membrane support material;

Etching the layer of first membrane support material and the layer of second membrane support material by applying the particular etching agent through the cavity, the etching taking place in at least one first region located in an extension of the cavity along a direction substantially perpendicular to the first main surface of the substrate arrangement and also taking place in a second region surrounding the first region, wherein the etching creates a tapered surface on the layer of second membrane support material in the second region caused by a difference between the first etching rate and the second etching rate; and Continuing the etching at least until the layer of second membrane support material has been removed in the first region to expose the layer of membrane material.

The teachings disclosed in connection with FIGS. 4 to 6 are intended to improve compressive strength of the membrane fixation; a current experiment shows an improvement by a factor of 2-3 compared to a membrane support having substantially vertical edges.

Figure 7:
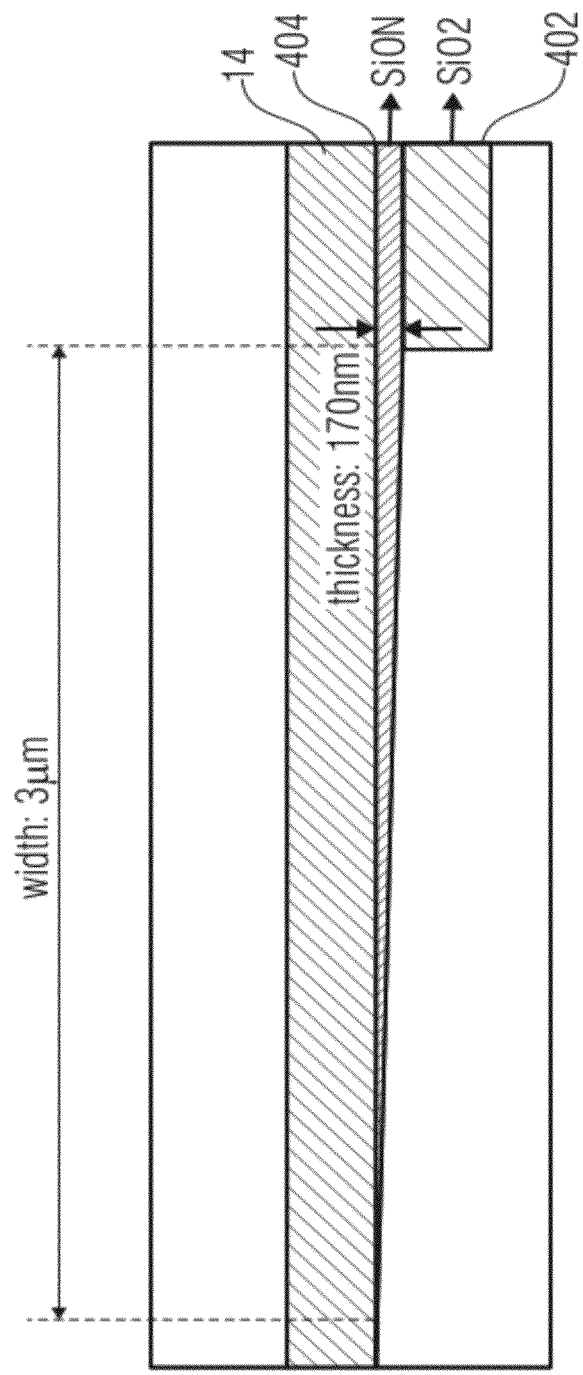
FIG. 7 illustrates a result of a mechanical simulation of a part of a membrane and its support structure when no external pressure or force is exerted on the membrane.

FIG. 7 shows a partial, schematic cross section of a micromechanical sound transducer according to the first possible configuration. In particular, FIG. 7 illustrates a stress distribution in the membrane 14, in the layer of first membrane support material 402 ($SiO_2$), and in the layer of second membrane support material 404 (SiON), when the membrane 14 is in an unloaded state. No externally induced stress is present and the intrinsic mechanical tension of the various materials is evenly distributed.

Figures 8A, 8C:
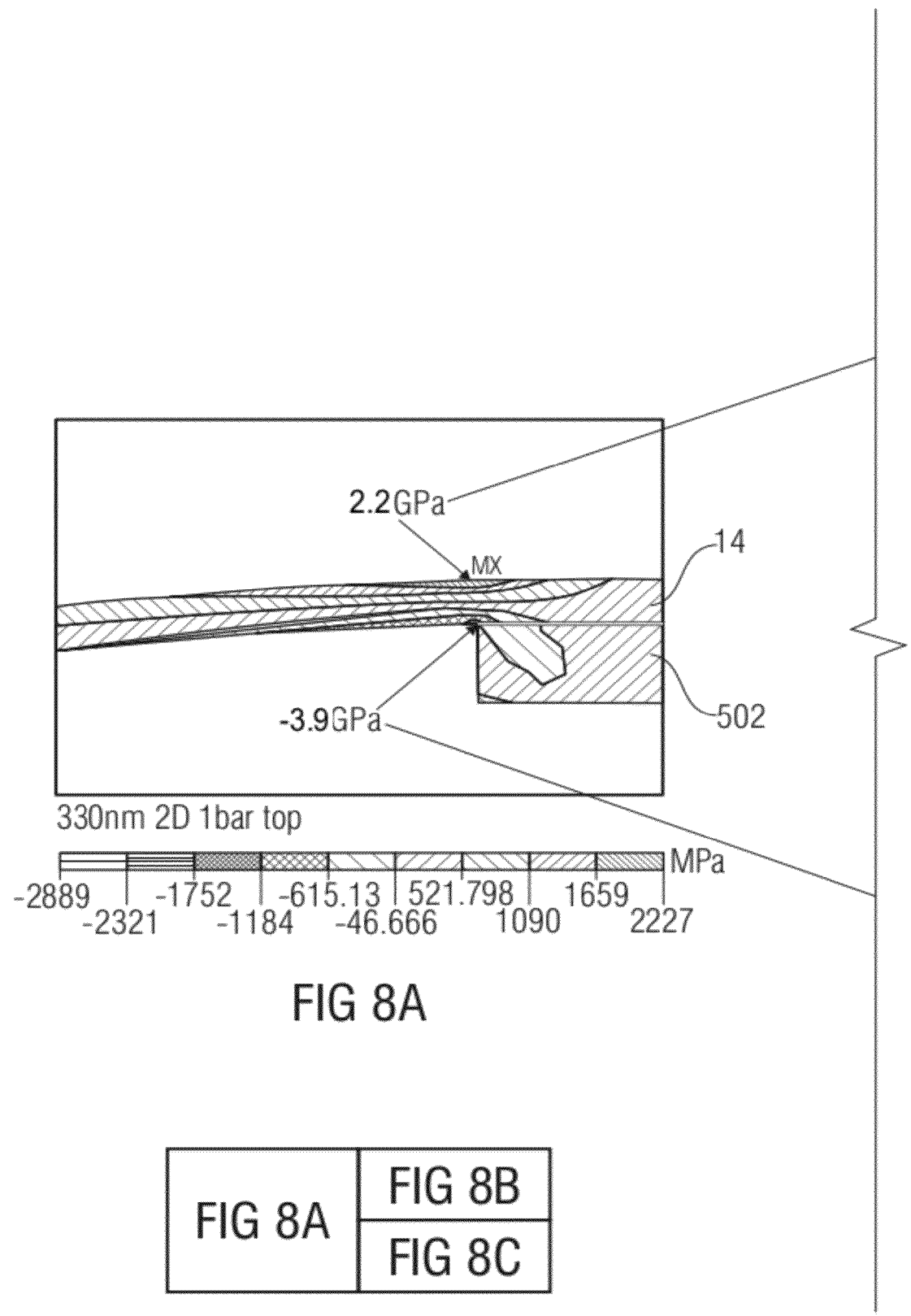
FIG. 8 shows in FIG. 8A, a result of a mechanical simulation of a membrane and its support structure that is formed without implementing the teachings disclosed herein, in FIG. 8B, a mechanical simulation of a membrane solicited from the top and its membrane support structure configured according to the teachings disclosed herein, and in FIG. 8C, a result of a mechanical simulation of a membrane solicited from beneath and its membrane support structure configured according to teachings disclosed herein.
Figure 8B:
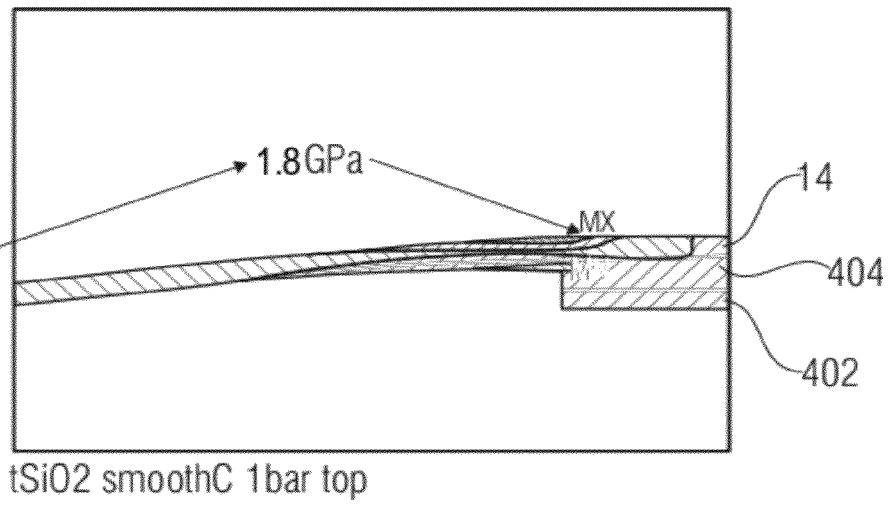
Figure 8C:
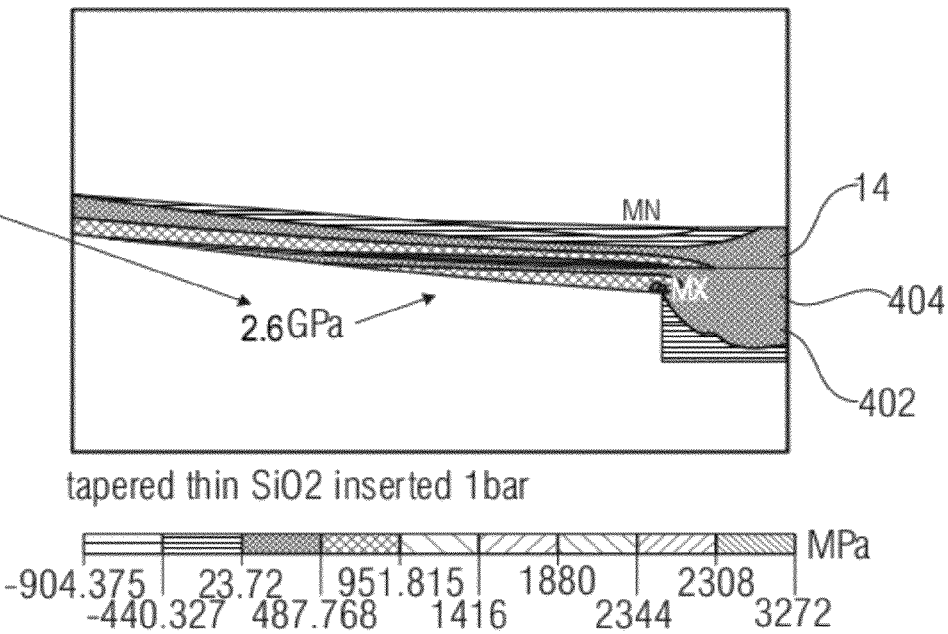

FIGS. 8A to 8C show results of a mechanical simulation of a collar structure when a pressure impinges on the membrane 14. In FIG. 8A, the result of a simulation of a configuration not having a tapered surface or a similar structure is shown. It can be seen that the mechanical stress within the membrane 14 and the membrane support material 502 reaches relatively high absolute values of 2.2 GPa and 3.9 GPa, respectively, at the corner formed by a substantially vertical edge of the membrane support material 502 and a substantially horizontal surface of the membrane 14. The marks "MX" and "MN" approximately indicate the regions where a maximal stress and a minimal stress occurs, respectively.

In FIG. 8B, the result of a mechanical simulation of a configuration having a collar with a tapered surface is shown, when a pressure is applied from the top. The maximum of the stress amounts to 1.8 GPa and can be observed at the upper surface of the membrane 14. In FIG. 8C, the result of a mechanical simulation of the same configuration having a collar or collar-like structure is shown for the case in which the pressure is applied from below. The maximum pressure amounts to approximately 2.6 GPa and can be observed in the vicinity of the tip of the tapered surface of the second membrane support material 404.

Figures 9A, 9B:
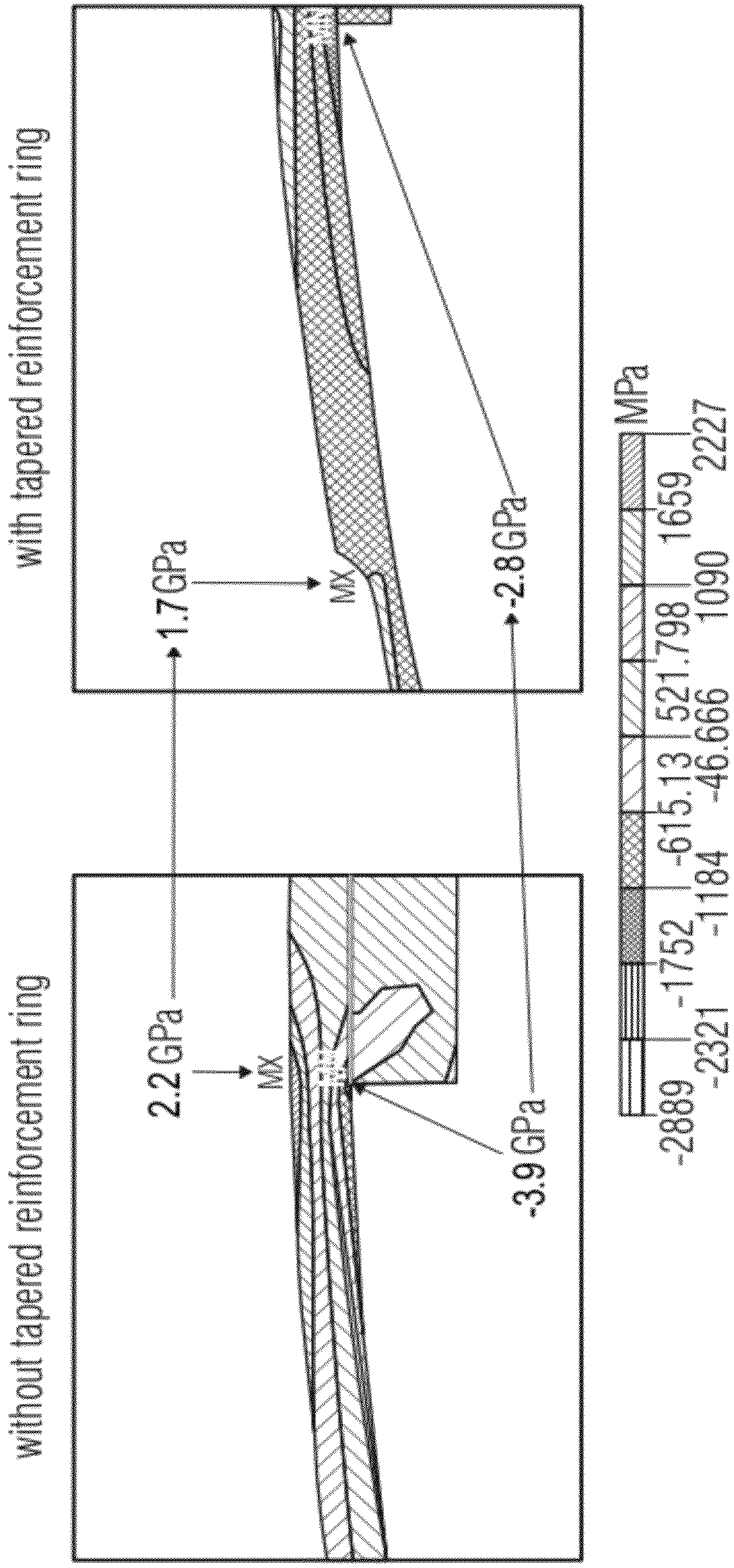
FIG. 9 shows in FIG. 9A, a result of a mechanical simulation of a membrane solicited from above and its membrane support structure in which the teachings disclosed herein are not used, and in FIG. 9B, a result of a mechanical simulation of a membrane solicited from above and its membrane support structure according to the teachings disclosed herein, in particular comprising a reinforcement ring.

FIGS. 9A and 9B show a comparison of results of a mechanical simulation for a configuration without and with a reinforcement ring. FIG. 9A corresponds to FIG. 8A, i.e., the result of the mechanical simulation when a pressure of 1 bar is applied from the top to the membrane of the configuration without a tapered reinforcement ring. FIG. 9B shows the result of the mechanical simulation for the configuration having a tapered reinforcement ring in the same situation, i.e. a pressure of 1 bar from the top. At the corner between the membrane support structure and the membrane 14 a maximal absolute value of 3.9 GPa for the stress is reached for the configuration without reinforcement ring. This compares to a maximal absolute value of 2.8 GPa for the configuration having a tapered reinforcement ring. At the upper side of the membrane, the maximal absolute value for the configuration without the reinforcement ring (FIG. 9A) is 2.2 bar, and the maximal absolute value for the configuration having the reinforcement ring (FIG. 9B) is 1.7 GPa.

The maximal value of the tension or stress depends, inter alia, on the angle of the tapered surface. The following table illustrates this dependency:

| Pressure 1 bar | Angle (degrees) | max. tension (GPa) | |
|---|---|---|---|
| | | with reinforcement ring | without reinforcement ring |
| from beneath (back side) | 90 | 3.0 | 3.9 |
| | 45 | 3.1 | |
| | 30 | 2.8 | |
| | 20 | 2.8 | |
| | 10 | 2.8 | |
| from above (front side) | 90 | 3.4 | 2.2 |
| | 45 | 3.2 | |
| | 30 | 2.8 | |
| | 20 | 2.4 | |
| | 10 | 1.7 | |

For the purpose of comparison, the right column contains the values for the configuration without a reinforcement ring. The tension or stress distribution in the transition between the membrane 14 and the reinforcement ring is highly dependent on the angle of the edge. The smaller the angle, the smaller the maximum strain and the higher the compressive strength. Especially for the case of the membrane being loaded with a pressure from above, a significant reduction of the maximal stress can be observed between an angle of 90 degrees and an angle of 10 degrees.

The mechanical simulation is based on a finite element (FEM) simulation and shows a clear reduction of the maximal tension at the membrane support structure. This result has also been confirmed by first measurements concerning the compressive strength with an improvement factor of 2-3.

Figure 10:
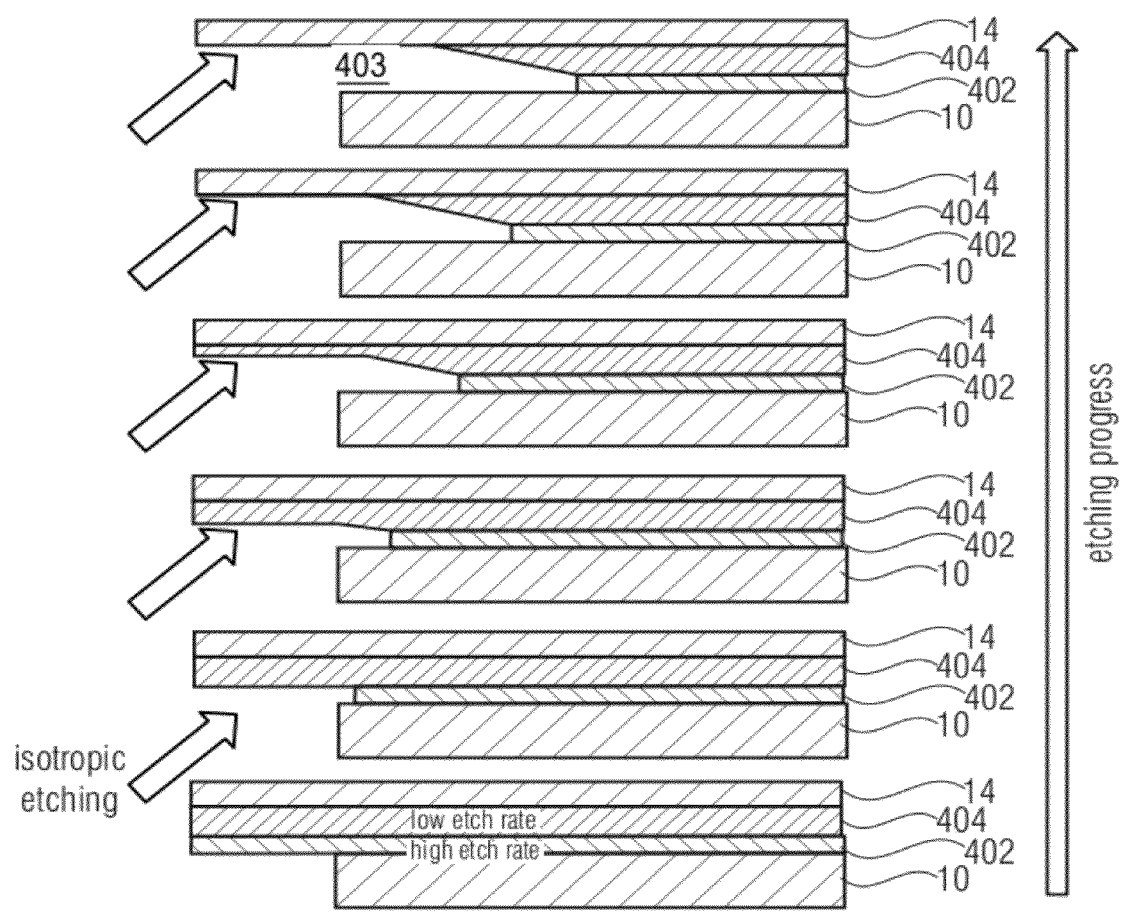
FIG. 10 illustrates a progress of an etching process observable when performing a method according to a first embodiment of the teachings disclosed herein.

FIG. 10 illustrates the progress of an isotropic etching process that may be employed during the manufacturing of a micromechanical sound transducer according to the first possible configuration, i.e. with the collar or collar-like structure. The collar structure may be produced, for example, by means of isotropic etching on a two-layer structure, one layer having a low etching rate, the other layer having a high etching rate. The dimensions of the collar are determined by the ratio of the etching rate and the layer thickness of the layer having low etching rate.

The initial configuration is shown in the lowermost picture of FIG. 10. On the main surface of the substrate 10, three layers of different materials have been created: the layer of first membrane support material 402 (high etching rate); the layer of second membrane support material 404 (low etching rate); and the layer of membrane material 14 (not substantially affected by etching process). The cavity 22 has been created in the substrate 10 previously to the etching process so that the layer of first membrane support material 402 is at least partially exposed, due to the cavity 22.

From bottom to top the further pictures in FIG. 10 show how the layer of first membrane support material 402 is etched relatively fast compared to the layer of second membrane support material 404. This leads to the creation of the tapered surface of the layer of second membrane support material.

Figure 11:
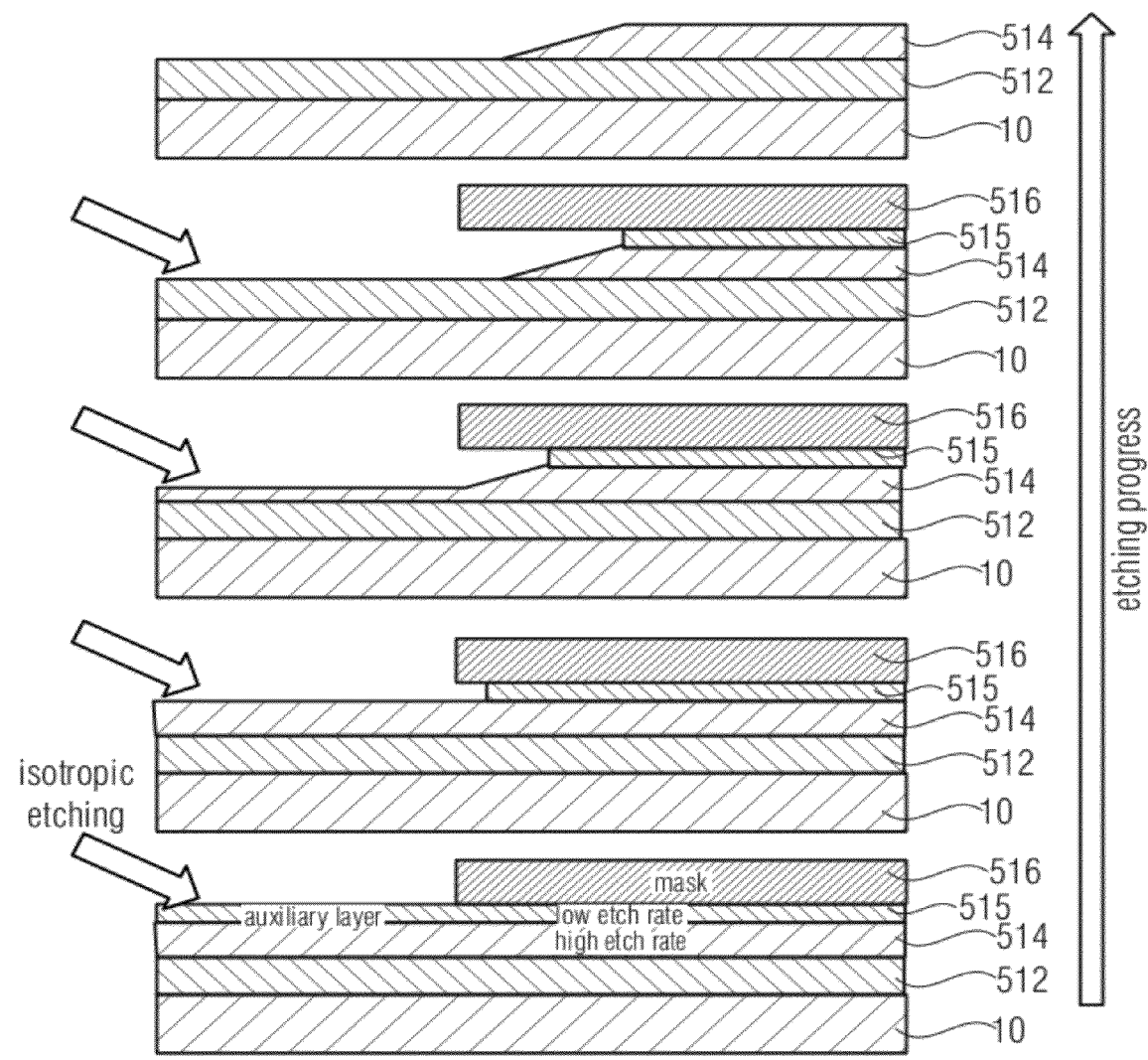
FIG. 11 illustrates a progress of an etching process observable during an execution of a method according to a second embodiment of the teachings disclosed herein.

FIG. 11 illustrates the progress of an isotropic etching process that may be employed during the manufacturing of a micromechanical sound transducer according to the second possible configuration. A first step comprises producing a support ring or reinforcement ring which has at least one inner edge that is strongly tapered, i.e. it has a relatively shallow slope. The edge shape may be produced, for example, by an auxiliary layer having a suitable layer thickness and a suitable etching rate. The auxiliary layer is typically completely removed at a later time.

In a second step subsequent to the manufacturing states shown in FIG. 11, the actual membrane layer is deposited over its support ring. If the reinforcement ring is sufficiently thick, the reinforcement ring by itself will represent the membrane support structure. This means that the actual membrane support structure of the reinforcement ring is uncritical in the event of compressive load being exerted.

Figure 12:
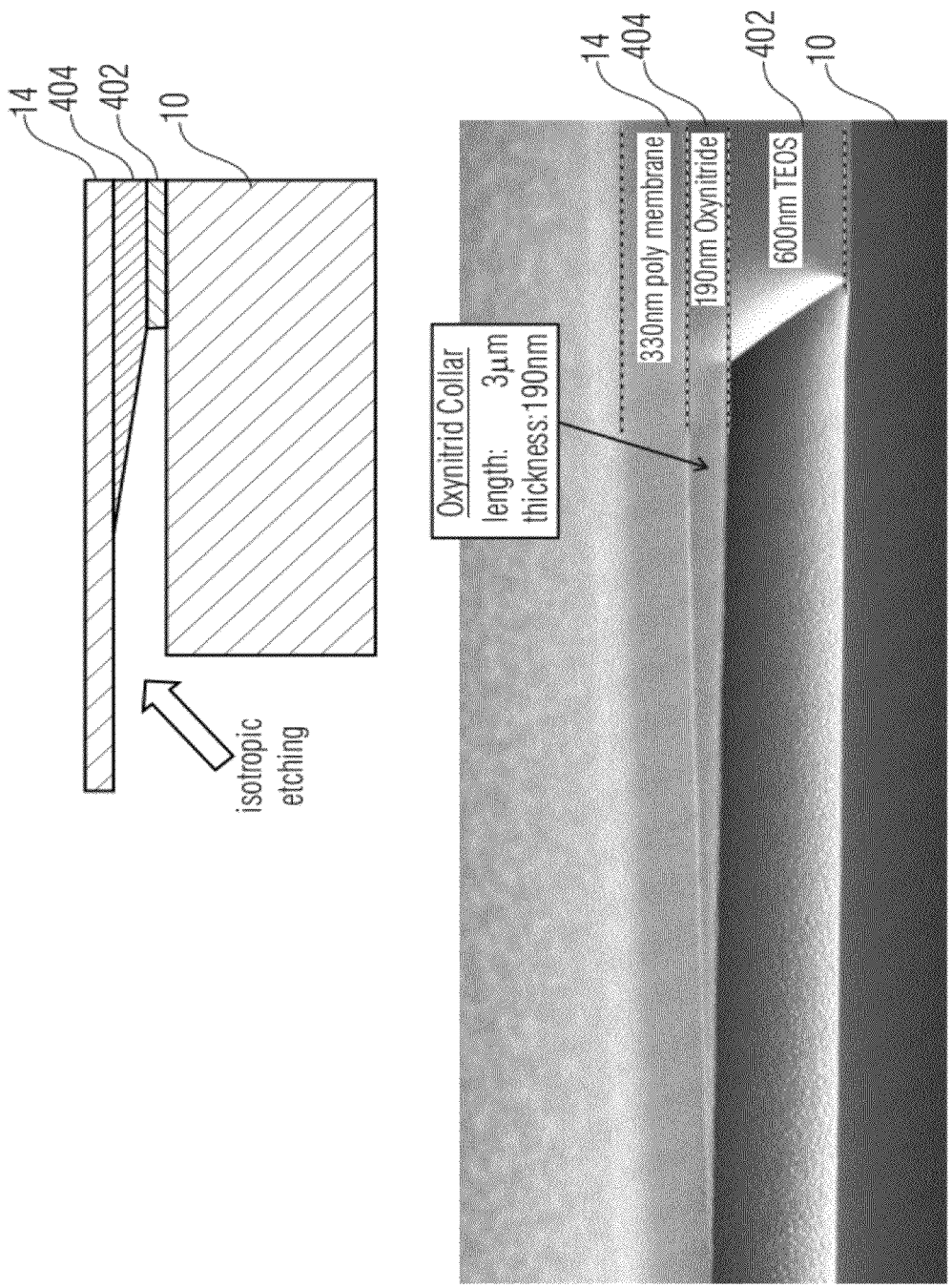
FIG. 12 shows in the upper part a schematic partial cross section of a micromechanical transducer according to the teachings disclosed herein, and in the lower part the corresponding raster electron microscope (REM) image.

FIG. 12 shows, in the upper part, again a partial, schematic cross section through a micromechanical sound transducer according to the teachings disclosed herein. In the lower part of FIG. 12 an electron microscope image of the partial cross section is shown. On top of the substrate 10, a layer of first membrane support material (here: TEOS) 402 is provided and has the tapered surface delimiting the aperture 403. The thickness of the layer of first membrane support material 402 is 600 nm. The layer of second membrane support material 404 comprises, e.g., silicon oxynitride. In this configuration, the layer of second membrane support material 404 also has a tapered surface delimiting the aperture 403. The thickness of the layer of second membrane support material 404 is 190 nm and the length of the collar formed by the layer of second membrane support material is 3 µm. Above the layer of second membrane support material 404, the layer of membrane material 14 is provided which has a thickness of 330 nm. The membrane material 14 is, in this example, poly silicon.

Figure 13:
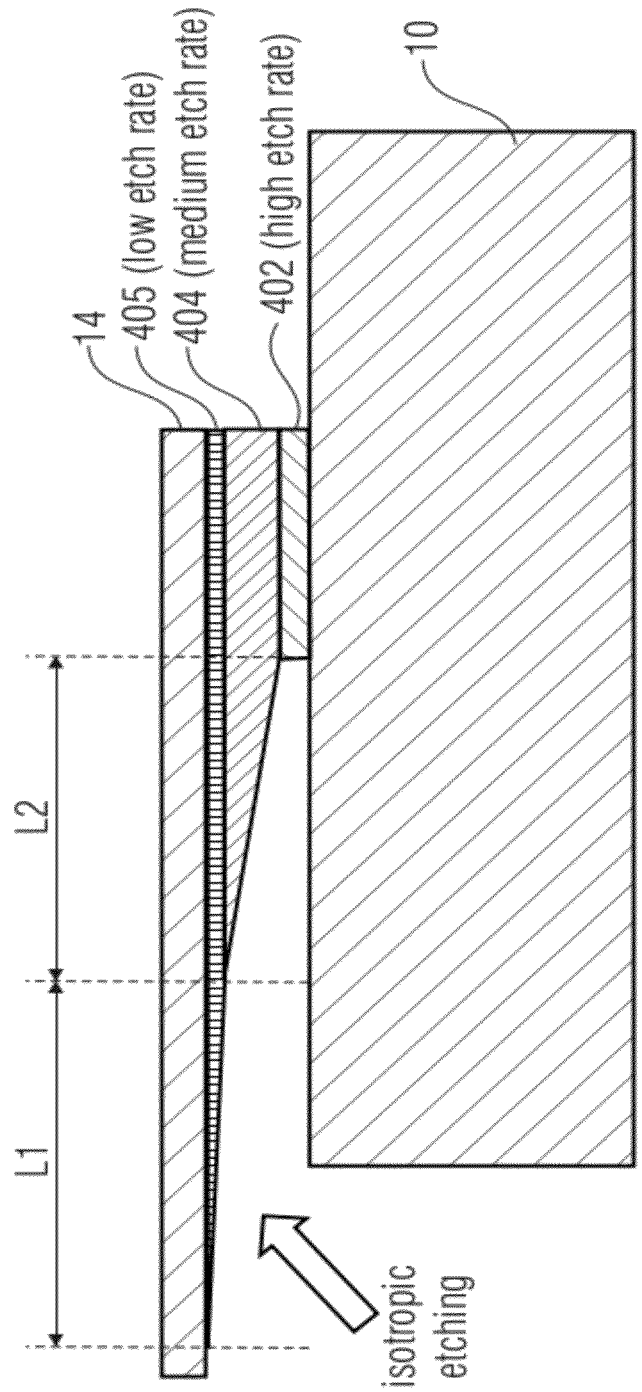
FIG. 13 shows a schematic, partial cross section of a micromechanical transducer according to a fourth embodiment of the teachings disclosed herein.

FIG. 13 shows a further development of the first possible configuration. Instead of an additional collar, a double layer structure having a decreasing etching rate may be used. The result will then be a double collar, the respective collar angle being defined by the etching rate, as explained above. Starting with the substrate 10, the stack of layers on the upper main surface of the substrate 10 is as follows: a layer of first membrane support material 402 having a high etching rate, a layer of second membrane support material 404 having a medium etching rate, and a layer of fifth membrane support material 405 having a low etching rate. The layer of membrane material 14 is provided on the upper surface of the layer of fifth membrane support material 405. Due to the different etching rates, the resulting tapered surface comprises two sections having different angles. The width of the tapered surface of the second membrane support material is $L_1$. The width of the tapered surface of the second support material is $L_2$.

Figure 14:
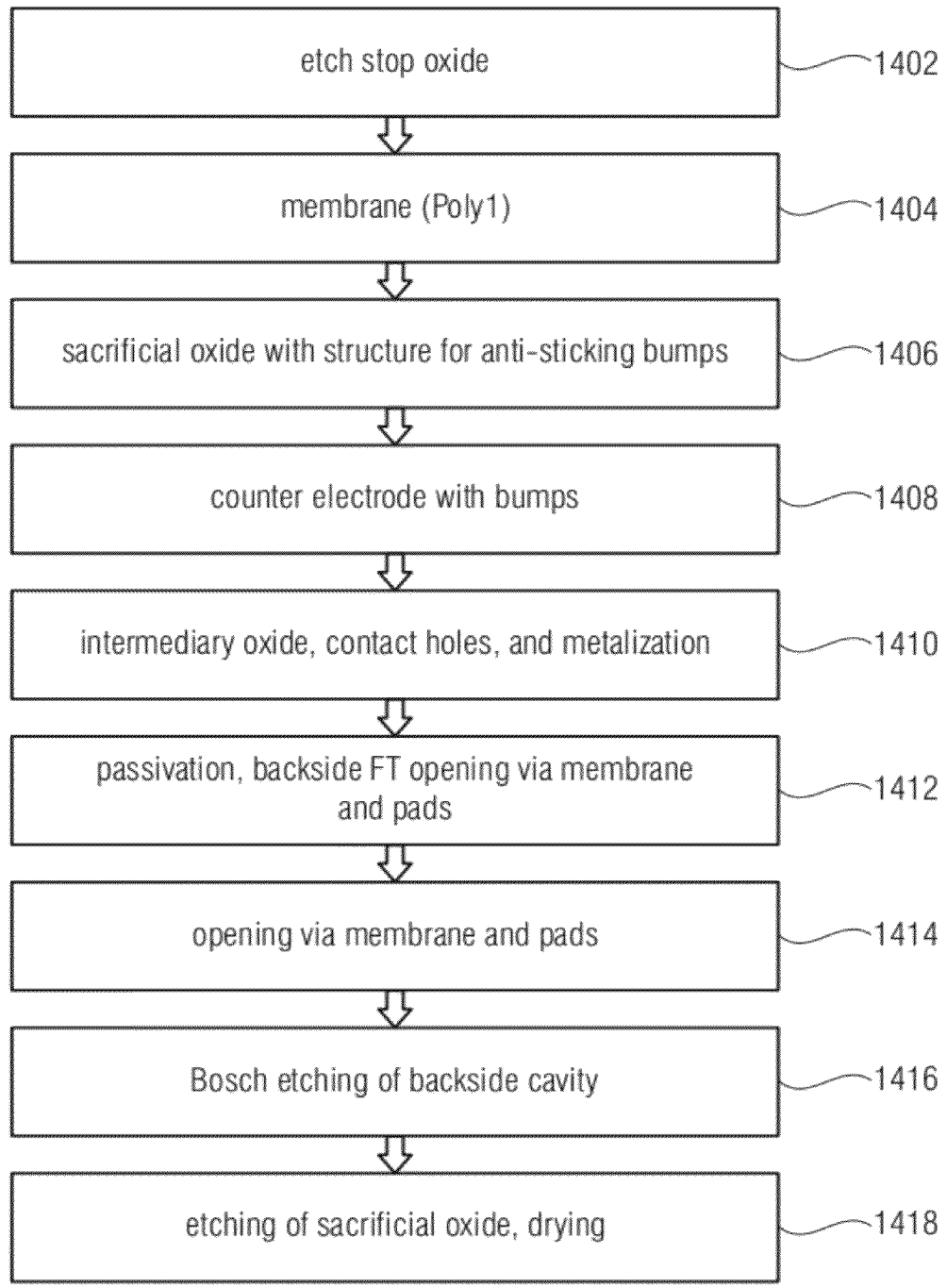
FIG. 14 illustrates a process for manufacturing a micromechanical sound transducer.

FIG. 14 shows a sequence of process blocks of a manufacturing process of a micromechanical sound transducer. First, an etch stop oxide is applied on the substrate 10, as shown by process block 1402 in FIG. 14. Then, at 1404, the membrane is created using a poly silicon. In a subsequent action 1406, a sacrificial oxide with a structure for anti-sticking bumps is formed. A counter electrode with corresponding anti-sticking bumps is then created during an action 1408. As indicated at the action 1410, an intermediary oxide, contact holes, and metallization are then formed. A passivation is then applied during an action 1412. A backside FT opening via the membrane and pad is also performed during the action 1412. An opening is then performed at 1414 above the membrane and the pads. The backside cavity 22 is then etched by means of a Bosch process, as indicated by action 1416. The sacrificial oxide is etched during the action 1418 and the micromechanical sound transducer is dried.

Figure 15A:
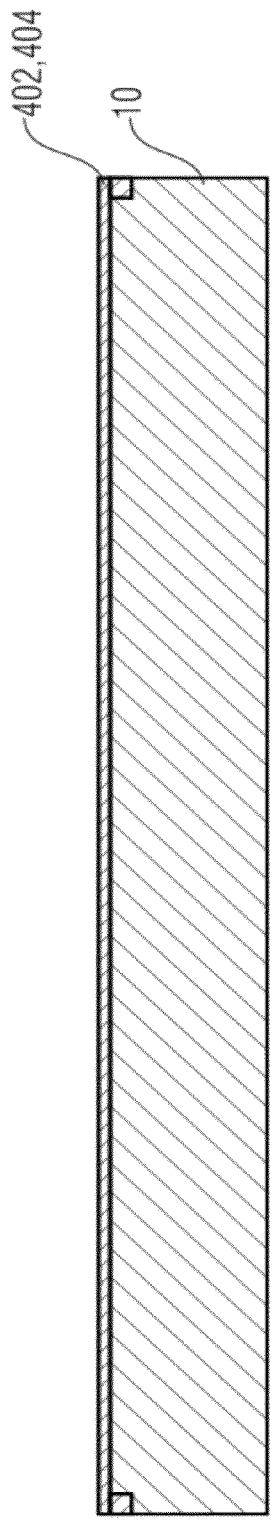
Figure 15B:
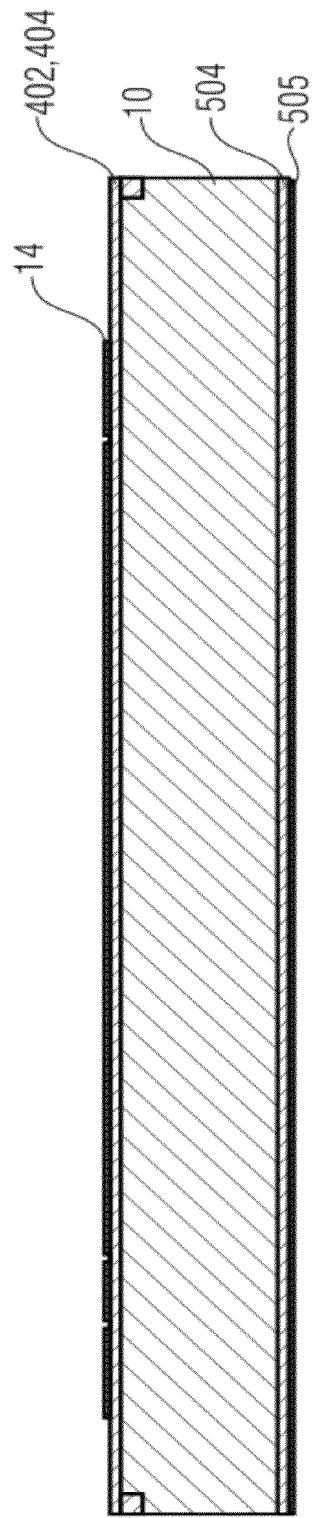

FIGS. 15A to 15M show schematic cross sections of a substrate 10 and layers applied to the substrate 10 at different process stages. Note that throughout the description and the figures of this disclosure any sizes and thicknesses should be understood as examples. FIG. 15A shows the substrate 10 and two layers of membrane support materials 402 and 404 that have been deposited on the upper main surface of the substrate 10. For example, 600 nm of TEOS may be deposited as the layer of first membrane support material 402 and 140 nm of silicon oxynitride SiON may be deposited as the layer of second membrane support material 404. As illustrated in FIG. 15B, a layer of poly silicon for the future membrane 14 is deposited on the layer of second membrane support material 404. The poly silicon is implanted and then a masked silicon etched is performed in order to structure the poly silicon of the future membrane 14. A layer of oxide 504 and a silicon layer 505 are deposited also at the backside of the substrate 10.

FIG. 15C shows how a further layer of TEOS 32 with a thickness of 1600 nm is created on top of the membrane layer 14 to create the future membrane support structure. A part of this further layer of TEOS will be removed to define a gap between the membrane 14 and the counter electrode 16. Hence, the TEOS temporarily encases the future membrane 14 and in particular temporarily fills the future air holes 4. A masked TEOS etch with a depth of 450 nm is also performed to provide structures 72 for the formation of anti-sticking bumps 2 of a counter electrode (see FIG. 15D). Between FIGS. 15C and 15D a layer of silicon nitride SiN 162 having a thickness of 140 nm has been applied to the upper surface of the configuration shown in FIG. 15C. The layer of silicon nitride 162 comprises the anti-sticking bumps 2 which have been obtained from filling the structures 72 in the TEOS layer 32. On top of the silicon nitride layer 162 another layer of TEOS is created having a thickness of 750 nm.

Figure 15E:
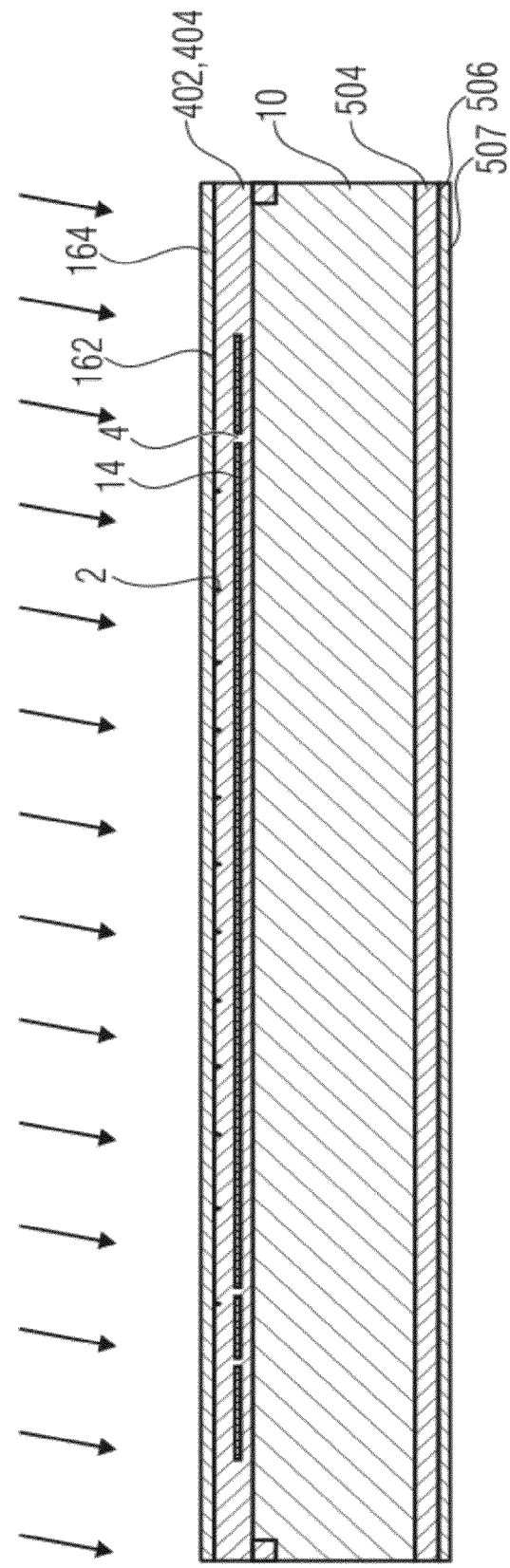
Figure 15F:
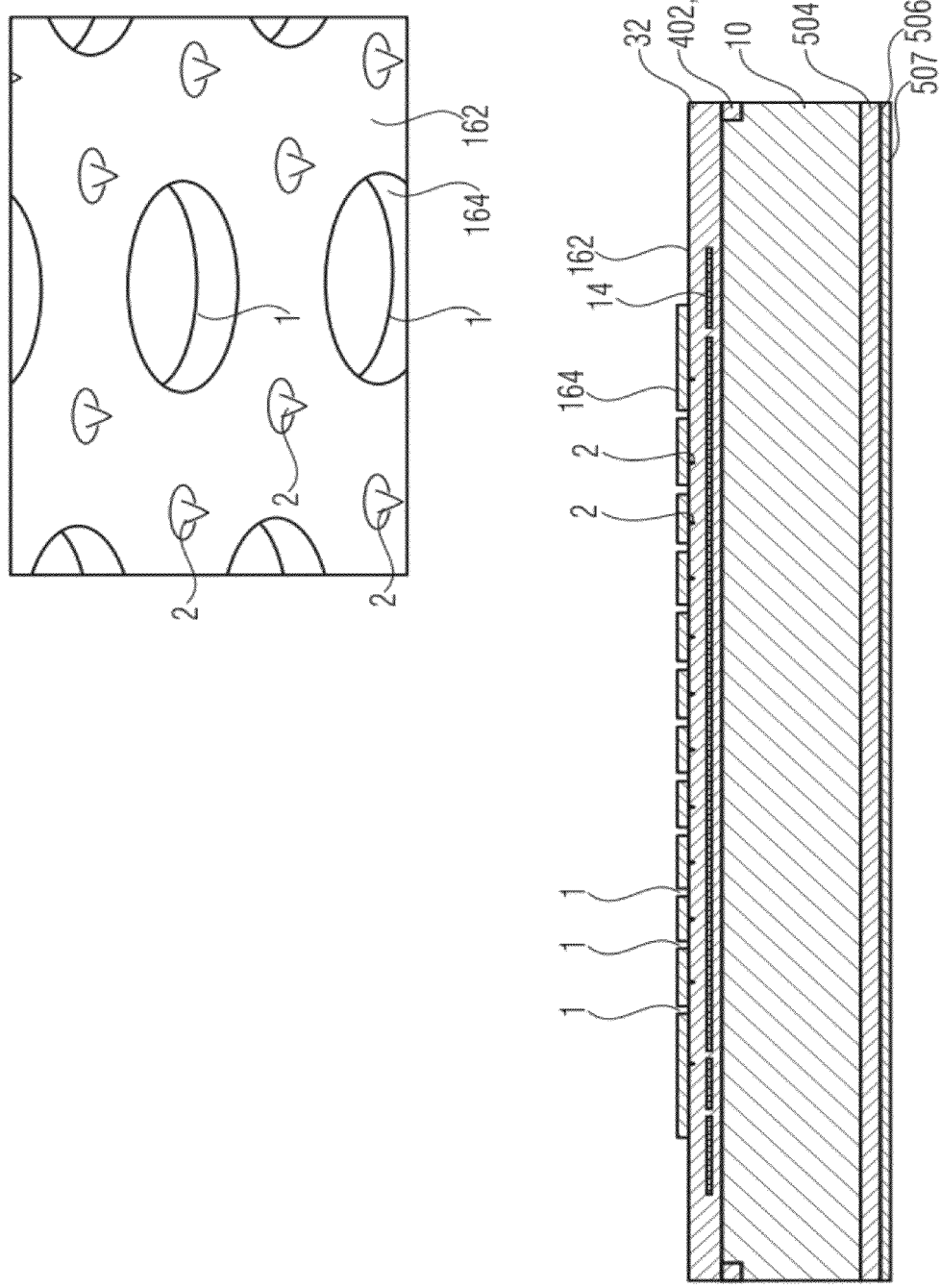

Then, as shown in FIG. 15E, a layer of amorphous silicon (a-Si) 164 is created with a thickness of 1400 nm. The amorphous silicon layer 164 is then implanted (schematically represented by the arrows) and a crystallization is performed. FIG. 15F shows the result of a masked etching step performed on the silicon nitride layer 162 and the silicon layer 164. Besides an outer contour of the future counter electrode 16, the masked etching also creates air holes 1 in the two layers. The upper part in FIG. 15F shows a perspective view of the silicon nitride layer 162 and the amorphous silicon layer 164 from beneath once the sacrificial oxide 32 between the membrane layer 14 and the silicon nitride layer 162 has been removed at a later stage of the process. The anti-sticking bumps 2 and the air holes 1 can be seen in this representation. The anti-sticking bumps 2 prevent the membrane 14 from sticking to the counter electrode 16 due to excessive adhesive forces.

FIG. 15G shows the result of a further etching step, this time affecting the TEOS layer 32. The etching step is masked so that only selected areas of the oxide layer 504 are removed, in particular at the edges in order to structure a contour of the oxide layer 504. In FIG. 15H, a further layer of silicon oxide $SiO_2$ has been created with a thickness of 150 nm. Moreover, a layer of borophosphosilicate glass (BPSG) 563 has been formed with a thickness of 800 nm. A masked oxide etch is then performed to create contact holes 564 to the membrane layer 14, the counter electrode layers 162, 164, and the substrate 10. As shown in FIG. 15I, the contact holes are filled with a titanium, platinum and/or gold with thicknesses of 50 nm, 100 nm, and 600 nm, respectively, to provide metal contacts 565. The filling of the contact holes is achieved by a masked metallization step.

In FIG. 15J a hardmask backside step has been performed. First, an unmasked silicon etch from the backside has been performed in order to remove the silicon layer 505 applied earlier. Then, a masked silicon oxide etch from the backside is performed in order to define the structure of the backside cavity 22 in the silicon oxide layer 504. A passivation 566 (typically SiN) is also applied to the front side in order to protect the front side structures created so far. FIG. 15K shows the micromechanical sound transducer after a pad and membrane opening has been performed. To this end, a masked silicon nitride etch has been carried out so that the contact pads 565 and a central portion of the borophosphosilicate glass layer 563 are exposed.

FIG. 15L shows the result of performing a Bosch process from the backside to create the cavity 22. The etching that is part of the Bosch process stops at the TEOS layer 402, 512 which acts as an etch stop. At the front side, a photoresist 567 is applied as a preparation for the subsequent process step, the result of which is shown in FIG. 15M.

Figure 15M:
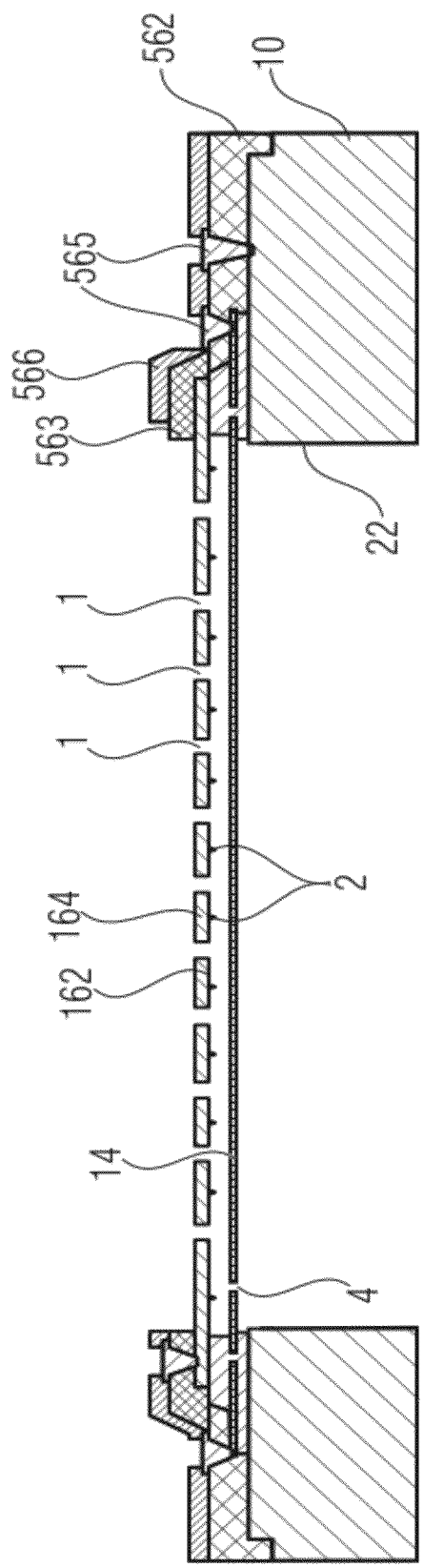

In FIG. 15M, a release etch has been performed from the front side as well as from the backside. The release etch enters the gap between the membrane 14 and the counter electrode 16 via the air holes 1 and the ventilation holes 4. After the completion of the release etch, the photoresist 567 is removed and the structure is cleaned. While the Bosch process to create the cavity 22 is a fast and relatively coarse process, the release etch typically is more precise so that the aperture of the membrane 14 and the gap between membrane and counter electrode can be formed in a relatively precise manner. The shape and the dimensions of the aperture 403, 513, 603 can have an influence on the mechanical properties of the membrane 14, in particular with respect to resonance frequency and damping. In order to obtain reproducible results, it is desirable to be able to control the release etch relatively precisely. The result of the release etch is typically predictable with good accuracy so that e.g. the duration of the etching, the concentration and/or the temperature of the etching agent can be adjusted to obtain a desired etching result.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:
1. A micromechanical sound transducer comprising:
a substrate arrangement;
a membrane support structure comprising a layer of first membrane support material adjacent to the substrate arrangement and a layer of second membrane support material at an interface of the layer of first membrane support material opposite to the substrate arrangement, wherein the first membrane support material has a first etching rate relative to a particular etching agent and the second membrane support material has a second etching rate relative to the particular etching agent that is lower than the first etching rate;
an aperture in the membrane support structure delimited by a tapered surface of the layer of second membrane support material; and a membrane that is exposed to the aperture and is fixed to the layer of second membrane support material at a surface of the second membrane support material opposite to the tapered surface.

2. The micromechanical sound transducer according to claim 1, wherein the substrate arrangement comprises a silicon bulk and an oxide layer adjacent to a main surface of the silicon bulk.

3. The micromechanical sound transducer according to claim 1, wherein the membrane support structure comprises a layer of fifth membrane support material at an interface to the layer of second membrane support material opposite to the layer of first membrane support material, wherein the fifth membrane support material has a fifth etching rate relative to the particular etching agent that is lower than the second etching rate, and wherein the layer of fifth membrane support material comprises a second tapered surface delimiting the aperture and having a different angle than the tapered surface on the layer of second membrane support material.

4. The micromechanical sound transducer according to claim 1, wherein the membrane support structure further comprises a third membrane support material adjacent to the second membrane support material and having a further tapered surface, and wherein the membrane is also fixed to the further tapered surface of the third membrane support material.

5. The micromechanical sound transducer according to claim 1, wherein the first membrane support material has a thickness between 400 nm and 800 nm.

6. The micromechanical sound transducer according to claim 1, wherein the second membrane support material has a thickness between 100 nm and 200 nm.

7. A micromechanical sound transducer comprising:
a substrate;
a membrane support structure overlying the substrate;
an aperture in the membrane support structure disposed such that a tapered surface spaces the membrane support structure from the substrate; and
a membrane that is fixed on and extends beyond the membrane support structure, the membrane being spaced from the substrate at least by the membrane support structure.

8. The micromechanical sound transducer according to claim 7, wherein the membrane support structure comprises a layer of first membrane support material adjacent the substrate and a layer of second membrane support material that is spaced from the substrate by the layer of first membrane support material, the first membrane support material being different than the second membrane support material.

9. The micromechanical sound transducer according to claim 8, wherein the first membrane support material has a thickness between 400 nm and 800 nm.

10. The micromechanical sound transducer according to claim 8, wherein the second membrane support material has a thickness between 100 nm and 200 nm.

11. The micromechanical sound transducer according to claim 8, wherein the first membrane support material comprises at least one of a silicon oxide or tetraethyl orthosilicate and wherein the second membrane support material comprises an oxynitride.

12. The micromechanical sound transducer according to claim 11, wherein the layer of first membrane support material has a thickness between 400 nm and 800 nm and wherein the layer of second membrane support material has a thickness between 100 nm and 200 nm.

13. The micromechanical sound transducer according to claim 8, wherein the tapered surface is formed in the layer of second membrane support material such that the layer of second membrane support material has a decreasing thickness over a lateral extent over the substrate.

14. The micromechanical sound transducer according to claim 13, wherein the membrane support structure comprises a layer of third membrane support material at an interface to the layer of second membrane support material opposite to the layer of first membrane support material, wherein the third membrane support material comprises a second tapered surface delimiting the aperture and having a different angle than the tapered surface on the layer of second membrane support material.

15. The micromechanical sound transducer according to claim 14, wherein the membrane is fixed on the third membrane support material.

16. The micromechanical sound transducer according to claim 15, wherein the third membrane support material comprises an oxynitride and has a thickness between 100 nm and 300 nm.

17. The micromechanical sound transducer according to claim 13, wherein the first membrane support material has a first etching rate relative to a particular etching agent and the second membrane support material has a second etching rate relative to the particular etching agent, the second etching rate lower than the first etching rate.

18. The micromechanical sound transducer according to claim 17, wherein the membrane support structure comprises a layer of third membrane support material at an interface to the layer of second membrane support material opposite to the layer of first membrane support material, wherein the third membrane support material has a fifth etching rate relative to the particular etching agent that is lower than the second etching rate, and wherein the layer of third membrane support material comprises a second tapered surface delimiting the aperture and having a different angle than the tapered surface on the layer of second membrane support material.

19. The micromechanical sound transducer according to claim 8, wherein the aperture in the membrane support structure is delimited by a tapered surface of the layer of second membrane support material.

20. The micromechanical sound transducer according to claim 19, wherein the membrane is exposed to the aperture and is fixed to the layer of second membrane support material at a surface of the second membrane support material opposite to the tapered surface.

21. The micromechanical sound transducer according to claim 8, wherein the membrane is exposed to the aperture and is fixed to the layer of second membrane support material.

22. The micromechanical sound transducer according to claim 7, wherein the substrate comprises a silicon bulk.

23. The micromechanical sound transducer according to claim 22, wherein the substrate further comprises an oxide layer adjacent to a main surface of the silicon bulk.

24. The micromechanical sound transducer according to claim 7, wherein the membrane support structure comprises a second tapered surface opposite the tapered surface.

25. The micromechanical sound transducer according to claim 24, wherein the second tapered surface has a different angle than the tapered surface.

26. The micromechanical sound transducer according to claim 24, wherein the membrane is fixed to the second tapered surface.

* * * * *